US 12,198,481 B2

(12) United States Patent
Robles et al.

(10) Patent No.: US 12,198,481 B2
(45) Date of Patent: Jan. 14, 2025

(54) MACHINE AND PROCESS FOR IDENTIFYING COMPONENT EFFECT ON PERFORMANCE OF A VEHICLE

(71) Applicant: The Boeing Company, Chicago, IL (US)

(72) Inventors: Jeffrey J. Robles, Houston, TX (US); Thomas S. Lowery, Houston, TX (US)

(73) Assignee: The Boeing Company, Chicago, IL (US)

(*) Notice: Subject to any disclaimer, the term of this patent is extended or adjusted under 35 U.S.C. 154(b) by 317 days.

(21) Appl. No.: 17/661,683

(22) Filed: May 2, 2022

(65) Prior Publication Data

US 2023/0351819 A1    Nov. 2, 2023

(51) Int. Cl.
*G07C 5/08* (2006.01)
*G06F 9/445* (2018.01)
*G07C 5/00* (2006.01)

(52) U.S. Cl.
CPC ....... *G07C 5/0808* (2013.01); *G06F 9/44505* (2013.01); *G07C 5/008* (2013.01); *G07C 5/0825* (2013.01)

(58) Field of Classification Search
CPC .... G07C 5/0808; G07C 5/008; G07C 5/0825; G06F 9/44505; G06F 30/28; G06F 30/15; G06F 30/20
See application file for complete search history.

(56) References Cited

U.S. PATENT DOCUMENTS

| | | | |
|---|---|---|---|
| 10,394,969 B2* | 8/2019 | Sasaki | G06F 30/20 |
| 10,703,508 B1* | 7/2020 | Mehnert | G06F 30/20 |
| 11,060,870 B2* | 7/2021 | Bhan | G01C 21/16 |
| 2013/0166271 A1* | 6/2013 | Danielsson | G06F 11/3668 703/22 |
| 2016/0117427 A1* | 4/2016 | Lindgärde | G05B 23/0243 703/8 |
| 2018/0257683 A1* | 9/2018 | Govindappa | B61L 27/57 |
| 2019/0294742 A1* | 9/2019 | Zhao | G01M 11/0221 |

* cited by examiner

*Primary Examiner* — Ig T An
*Assistant Examiner* — Christine Nguyen Huynh
(74) *Attorney, Agent, or Firm* — Yee & Associates, P.C.

(57) ABSTRACT

A machine and process for identifying an effect on a performance of a vehicle by a component thereof. The process may include a processor that may include a vehicle performance processor generating a simulation configuration file for a model of a mechanical system that controls the performance of the vehicle and for a power system that controls the mechanical system of the vehicle; providing a visual interface for selecting a degraded mode of a component within the mechanical system or the power system; generating a simulation configuration file introducing the degraded mode of a selected component within the model; running, using a modification scripting of the degraded mode of the selected component, a simulation generating performance data for the vehicle; and transforming the performance data to a visualization of the performance of the vehicle.

20 Claims, 11 Drawing Sheets

MACHINE AND PROCESS FOR IDENTIFYING COMPONENT EFFECT ON PERFORMANCE OF A VEHICLE

BACKGROUND INFORMATION

Field

The present disclosure relates generally to performance of a vehicle. More specifically, the present disclosure relates to a machine and process to identify an effect a component of the vehicle has on the performance of the vehicle.

Background

A vehicle may be formed of many components. Each component may independently, or in combination with some other component/sub-component and/or components/sub-components of the vehicle contribute to and/or at least affect the performance of the vehicle. Performance of the vehicle may include, without limitation, boundaries of an operating envelope, fuel efficiency, speed, acceleration, strength, durability, flutter, vibration, stiffness, flow dynamics, applied and/or resultant forces, control of movement of the vehicle about an axis of the vehicle, and/or reliability, of the vehicle as a whole and/or of any component and/or components thereof.

Currently, when a vehicle experiences a change in performance it is brought into a maintenance facility to try and identify and adjust a cause of the change in performance. The change may be a degradation of the performance of the vehicle and/or a component/sub-component and/or components/sub-components thereof. The degradation may include an undesired performance of the vehicle and/or a component and/or components thereof. Identifying and adjusting the change in performance currently involves applying a combination of maintenance manuals and technician experience and test equipment in the maintenance facility.

Current maintenance protocol for undesired performance of a vehicle predominantly follows a try-and-see process that replaces a suspected degraded component based upon a mechanics knowledge and experience or a diagnostic tree in a manual and the vehicle is given a "test-drive.". Precise analysis of dynamic performance of an interaction between components of the vehicle has not been available to identify a degradation from a desired performance of a particular component that may produce a degradation from a desired performance of the vehicle as a whole, or a degradation in the performance of the particular component and/or other components connected with and/or affected by the particular component.

As a non-limiting example, a roll rate of an aircraft may be reduced due to a degradation in a control rod in a roll control system for the aircraft. To date, identification of causes of undesired performance of a vehicle has relied heavily on the experience base of the operators, maintenance technicians, and/or engineers of the vehicle and "troubleshooting" guides published in manuals. Accordingly, precise identification, using an accurate dynamic functional model that applies state equations and/or equations of motion for the components that form the vehicle, of a degradation of performance of a component of a vehicle, derived from a reported degradation of a performance of the vehicle, is not available.

Therefore, it would be desirable to have a machine and/or a process that considers at least some of the issues discussed above, as well as other possible issues. For example, it would be desirable to have a machine and process that applies a functional model of the vehicle to identify, without reliance on a knowledge and/or experience of a technician, a degradation in a component of the vehicle that causes a degradation in the performance of the vehicle.

SUMMARY

An example of the present disclosure provides a novel machine and associated processes. The machine may perform a process for identifying a component effect on a performance of a vehicle. The process may include at least: generating a simulation configuration file for a mechanical system configured to control the performance of the vehicle; generating a simulation configuration file for a power system configured to control the mechanical system of the vehicle; providing a visual interface for selecting a degraded mode of a selected component within the mechanical system or the power system; generating a simulation configuration file that may include modification scripting introducing the degraded mode of the selected component within the mechanical system or the power system; running, using the simulation configuration file for the mechanical system and the simulation configuration file for the power system and the modification scripting of the degraded mode of the selected component, a simulation generating performance data for the vehicle; and transforming the performance data to a visualization of the performance of the vehicle.

The process for identifying the component effect on the performance of the vehicle may also include a performance of the vehicle moving in a fluid. The process for identifying the component effect on the performance of the vehicle may also include a performance of the vehicle moving in air. The vehicle may be an aircraft.

The mechanical system may include at least: mechanical components, and mechanical dynamics that include: applied forces and resultant forces on the mechanical components in a fluid flow. The mechanical system may be a flight control linkage for an aircraft. The mechanical system may be a flight control linkage for lateral control of an aircraft.

The performance data may include at least: a position of a tracked component within the mechanical system or the power system, forces upon and forces generated by the tracked component within the mechanical system or the power system, and a position and a motion of the vehicle. The performance data may include at least: a position of a tracked component within the mechanical system or the power system, forces upon and forces generated by the tracked component within the mechanical system or the power system, and a pitch, a roll, a yaw, a pitch rate, a roll rate, a yaw rate, a velocity, an acceleration, and a loading upon an aircraft.

The visual interface for selecting the degraded mode of the selected component may include a graphical user interface. The graphic user interface may present a schematic of at least: the mechanical system, or the power system, configured for receiving a selection of the selected component presented on the schematic.

The process for identifying the component effect on the performance of the vehicle may also include at least translating the performance data to a visualization may include using six degrees of freedom equations of motion for generating an output to a user interface that may provide a three-dimensional representation of the vehicle in motion over a period of time. Translating the performance data to a visualization may produce: a graphical presentation, and a data table presentation, of a performance, respectively, of:

the power system, the mechanical system, and the vehicle, in three dimensions. The power system may include a hydraulic system. The power system may include an electrical system. The power system may include a pneumatic system. The degraded mode may be selectable from a complete failure of the selected component through a range of less than full capability of the selected component.

Additionally, the novel machine may perform at least a second novel process for identifying, using performance data from a vehicle, a degraded mode of a component of a mechanical system or a power system in the vehicle. The second novel process may include at least: generating a simulation configuration file for the mechanical system configured to control a performance of the vehicle; generating a simulation configuration file for the power system controlling the mechanical system of the vehicle; generating a simulation configuration file that may include modification scripting introducing the degraded mode of a selected component within the mechanical system or the power system; running, using the simulation configuration file for the mechanical system and the simulation configuration file for the power system and the modification scripting of the degraded mode of the selected component, a simulation generating the performance data for the vehicle; translating the performance data to a visualization on a user interface of performance characteristics resulting from degraded mode of the selected component; receiving, on a visual interface, a selection of a selectable performance characteristics; and providing a visualization identifying the degraded mode of the selected component within the mechanical system or the power system.

Additionally, the novel machine may perform at least a third novel process for predicting a consequence of a single point failure in a mechanical system or a power system configured to control a performance of a vehicle. The third novel process may include: generating a simulation configuration file for the mechanical system; generating a simulation configuration file for a power system configured to control the mechanical system of the vehicle; providing a visual user interface for receiving a selection of a degraded mode of a selected component within the mechanical system or the power system; generating a simulation configuration file comprising modification scripting introducing the degraded mode of the selected component representing the single point failure within the mechanical system or the power system; running, using the simulation configuration file for the mechanical system and the simulation configuration file for the power system and the modification scripting of the degraded mode of the selected component, a simulation generating performance data for the vehicle; and transforming performance data from the vehicle to a visualization of the performance of the vehicle.

The third novel process may also include: running, using the simulation configuration file for the mechanical system and the simulation configuration file for the power system and the modification scripting of the degraded mode, respectively, of every component of the mechanical system and the power system, a simulation generating performance data for the vehicle; storing the performance data in a format rapidly accessible based upon at least each of: forces upon and forces generated by each component within the mechanical system or the power system, and a pitch, a roll, a yaw, a pitch rate, a roll rate, a yaw rate, a velocity, an acceleration, and a loading upon an aircraft.

A fourth novel process of the novel machine may include: using performance data from a vehicle in motion, a degraded mode for a component on the vehicle in motion, which may include: generating a simulation configuration file for a mechanical system configured to control a performance of the vehicle; generating a simulation configuration file for a power system controlling the mechanical system of the vehicle; generating a simulation configuration file that may include modification scripting introducing the degraded mode of a selected component within the mechanical system or the power system; running, using the simulation configuration file for the mechanical system and the simulation configuration file for the power system and the modification scripting of the degraded mode of the selected component, a simulation generating degraded performance data for the vehicle; receiving the performance data for the vehicle in motion; mapping the performance data for the vehicle in motion to the degraded performance data for the vehicle generated for the degraded mode of the selected component; and providing a visualization identifying the selected component within the mechanical system or the power system.

The features and functions can be achieved independently in various examples of the present disclosure. The features and functions can be combined in yet other examples. Further details of the features and functions can be seen with reference to the following description and drawings.

BRIEF DESCRIPTION OF THE DRAWINGS

The novel features believed characteristic of the illustrative examples are set forth in the appended claims. The illustrative examples, however, as well as a preferred mode of use, further objectives and features thereof, will best be understood by reference to the following detailed description of an illustrative example of the present disclosure when read in conjunction with the accompanying drawings, wherein:

DETAILED DESCRIPTION

Figure 1:
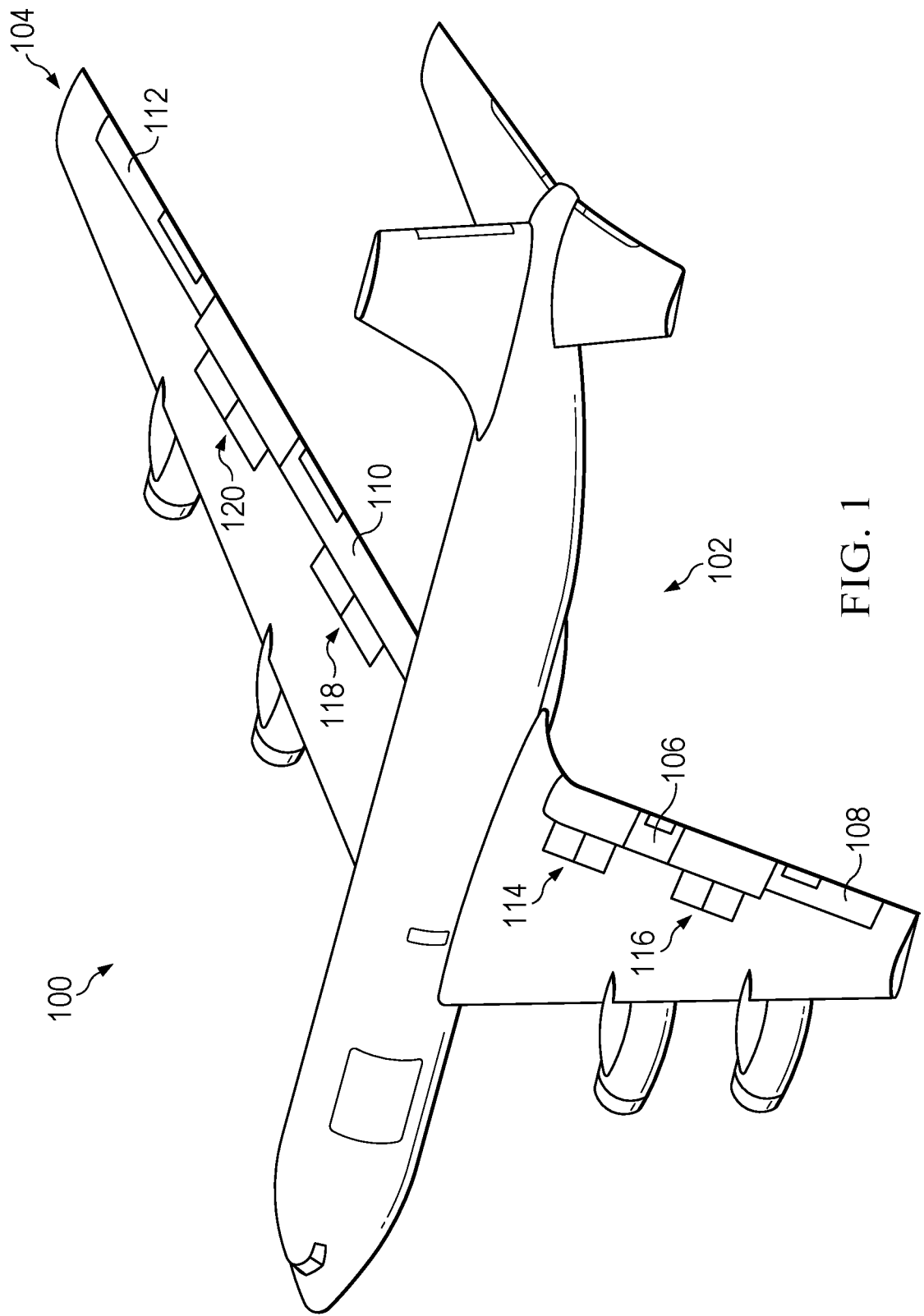
FIG. 1 is an illustration of a perspective view of a vehicle that may operate in motion through a fluid depicted in accordance with an illustrative example.

The illustrative examples recognize and take into account one or more different considerations. The illustrative examples recognize and consider that current fault analysis of a vehicle are oriented toward analysis of a fault in an individual component. The illustrative examples recognize and consider that currently there is no machine and/or process capable of precise verification and/or validation of operation of an individual component's affect upon performance of a vehicle and/or a system thereon, and/or interacting with a virtual model thereof before executing physical adjustments to the vehicle's hardware and/or software. There are no industry tools able to support rapid virtualization development that integrates with existing design and testing systems and can be used for development, validation, integration, verification by test, and reliability tracking for an individual component's affect on a performance of a vehicle and/or of a system thereof, such as without limitation a flight control system on an aircraft.

The illustrative examples recognize and take into account that each subsystem of a design, build and deployment for a component of a vehicle may have specific requirements that must be met during assembly, integration, and/or testing for at least compatibility, functionality, and/or reliability with other subsystem components as well as interactions with other systems. Subsequent verification, validation, and compliance for each subsystem will follow a format driven by the specific requirements for each subsystem and their interfaces. Verifications events may include analysis, demonstration, test, or inspection. Verification by test is one of several ways requirements can be checked as being fulfilled.

Current systems to identify, test, and adjust individual component effects on actual physical components of a vehicle in motion can be prohibitively time consuming and expensive. The illustrative examples recognize and take into account that current analytical techniques do not allow for a visualization and/or animation/virtualization of interactions of components of components of a vehicle in motion to the extent necessary for design, validation, and/or verification by test of the vehicle in motion in a fluid, such as without limitation an aircraft and/or a flight control system thereof, at least because existing techniques are based on individually/sequentially performing components without a full integration of their effect on each other.

Examples herein present a novel analysis system and process configured to simulate and that in operation may simulate and/or interactively model the mechanical behaviors of an equivalent physical vehicle in operation. Examples herein present a novel system and process of a modeling environment configured to model and that in operation may model operation of a dynamic control linkage schematic for operation of a control linkage system for the vehicle. Without limitation, control linkage schematic may be for a vehicle in motion through a fluid. Without limitation, vehicle may be an aircraft. Without limitation, control linkage may be for a Lateral Control System (LCS) for the aircraft. Examples herein present a novel system and process for modification scripting to introduce faults and/or loads into the control linkage schematic for analysis of the linkage control system. Examples herein present a novel system and process for modification scripting to a simulator application configured to simulate and that in operation may simulate effects of out-of-specification conditions and/or loads on the vehicle, the control and control linkage systems, and of components thereof. Examples herein present a novel system and process for displaying output of a 3-dimensional (3D) representation providing illustrating the effects of faults from a simulation for the control and control linkage systems, and of components thereof. Examples herein illustrate a technologically improved system and process that solves a problem with existing vehicle performance troubleshooting approaches, wherein an individual mechanical fault is instantiated and analyzed.

What is needed is a virtual vehicle performance modeling environment wherein the initial parameters of the virtual system may be selected and provided through a user interface accessible to at least a designer and/or an analyst and/or mechanic, and virtual test equipment configured to simulate and that in operation may simulate equivalent physical test equipment. Responsive to the need, examples herein introduce a novel technological system and process that provide a modeling environment that establishes an executable block diagram for performing a simulation of control and control linkage systems and their effect on performance of systems of and/or of a vehicle as a whole that is controllable and observable through a user interface.

Hence, examples herein describe a novel machine and process that enable virtualizing in a visual simulation and interacting with a virtual model thereof at least for systems of a vehicle in motion including at least control and/or control linkage systems. The machine and process described herein enable improvements in speed, accuracy, specificity, precision, and quality across all phases of at least design, manufacturing, operation, and maintenance of a vehicle, at least by aiding the technical community in at least analysis, documentation, integration, and system functionality investigations during at least design, manufacture, and/or operation of the vehicle and systems thereof. Without limitation, operation of the vehicle may include flight of an aircraft and hence of components thereof to include without limitation flight control systems and components thereof. Further still, examples of the machine and process as described herein produce a virtualization and interaction with a virtual model thereof that may serve at least as a test engineering development, verification by test, reliability validation tool, operational system performance, and/or maintenance analysis tool for, without limitation a vehicle in motion. Finally, examples of the machine and process as described herein may be used as a tool to develop procedures at least for test engineering development, verification by test, reliability validation tool, operational system performance, and/or maintenance analysis tool for without limitation a vehicle in motion.

Examples herein describe a machine and a process that enable a performance of an effect of a component on a performance of a vehicle to be designed, verified, and validated in a virtual environment. The illustrative examples recognize and take into account that such a machine and process are able to reduce time and/or human error in the development, review, and analysis of performance issues for a vehicle overall and for systems thereof. Thereby, both the reliability and first time accuracy of design, production, performance, analysis, and/or maintenance are enhanced by the machine and process embodied herein.

The illustrative examples recognize and take into account that such a novel machine and process provide technological improvements over existing process and machines that evaluate analysis of a fault in an operation and/or performance of a vehicle by focusing on a component individually. The illustrative examples recognize and take into account that there is a need for, and provide at least an example for a novel technological solution that may provide a graphical user interface and simulator for modeling, which is configured to include modification scripting and that in operation may include modification scripting to introduce faults/loads and simulate effects of an out-of-specification (degraded mode) condition, or a load applied to a component, and provide a three-dimensional representation illustrating the effects on aerodynamic behavior or other operating aspects of the vehicle of the out-of-specification condition/load, for a control system for a vehicle.

Turning now to FIG. 1, FIG. 1 is a perspective view of a vehicle that may operate in motion through a fluid depicted in accordance with an illustrative example. Without limitation, the vehicle that may operate in motion through a fluid may be an aircraft shown as vehicle 100 in FIG. 1. As depicted in FIG. 1, and without limitation, vehicle 100 may be an aircraft. Motion of vehicle 100 may be controlled at least in part by controls 102 in a lateral control system (LCS) 104 that may include components that may include, without limitation, at least: port in-board aileron 106, and port out-board aileron 108, starboard in-board aileron 110, starboard out-board aileron 112, port in-board spoiler 114, port out-board spoiler 116, starboard in-board spoiler 118, and starboard out-board spoiler 120, as well as sub-components thereof and linkages therefor and therebetween (not shown). As depicted in FIG. 1, and without limitation, controls 102 for vehicle 100 may represent components and/or sub-components of flight controls for in a flight control system of an aircraft.

Figure 2:
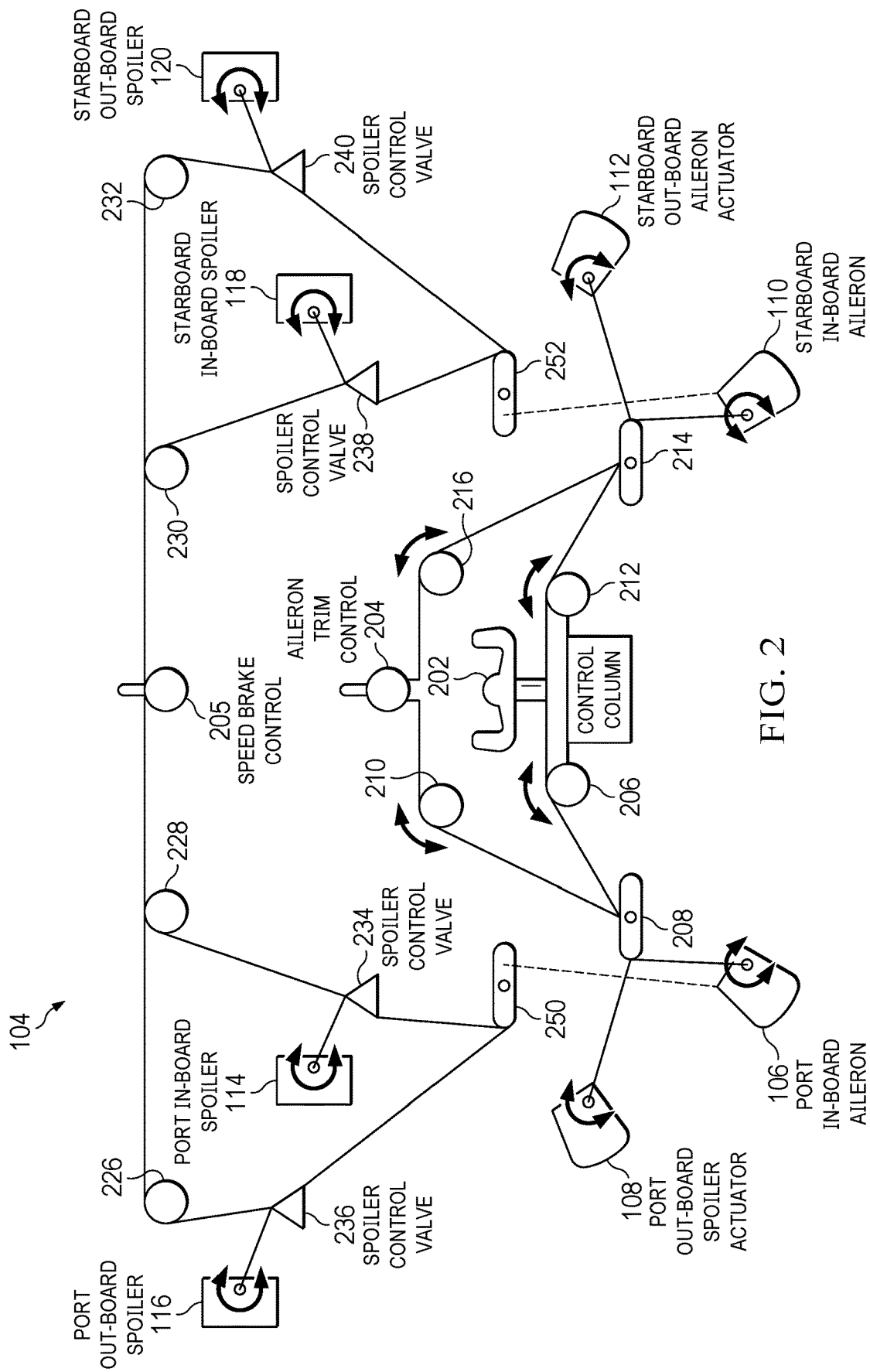
FIG. 2 is an illustration of a plan view of a schematic of a system used to control a motion of a vehicle depicted in accordance with an illustrative example.

Turning now to FIG. 2, FIG. 2 is a plan view of a schematic of a system used to control a motion of a vehicle depicted in accordance with an illustrative example. In the illustrative examples, the same reference numeral may be used in more than one figure. This reuse of a reference numeral in different figures represents the same element in the different figures.

More specifically, but without limitation, FIG. 2 displays a plan view schematic for Lateral Control System (LCS) 104 for a vehicle such as without limitation vehicle 100 as shown in FIG. 1. One of ordinary skill in the art recognizes that LCS 104 of FIG. 2 may be representative of a control linkage for a system involved in controlling a performance of a vehicle moving through a fluid. While FIG. 2 may provide a simplified example of a schematic for a lateral control linkage in LCS 104 of vehicle 100, and is not intended to represent all components possible in a complete lateral control linkage schematic for vehicle 100. One of ordinary skill in the art recognizes that the concept of a system schematic for control of various performance elements of a vehicle in motion may be generally and specifically applied to other specific systems of the vehicle.

Similarly, while a simplified example of a lateral control system for a vehicle is shown and discussed herein, it is used as an example that one of ordinary skill in the art understands may be equally applied (although not diagramed and explicitly described herein) to a longitudinal or vertical or other oriented control system for a vehicle. Hence, one of ordinary skill in the art recognizes that discussions herein that apply to a lateral control system for roll of a vehicle may be adapted to a longitudinal control system for pitch of the vehicle or a vertical control system for yaw of the vehicle.

LCS 104 shown may provide controls to an operator of vehicle 100 such as without limitation: control column 202, aileron trim control 204, and speed brake control 205. Control column 202, aileron trim control 204, and speed brake control 205 may be physical items physically controlled by the operator of vehicle 100 in motion, or without limitation may represent an electronic interface configured to receive and relay commands and that in operation may receive and relay commands for operation of respective portions of LCS 104 as indicated without limitation in FIG. 2.

Control column 202 and aileron trim control 204 are connected to each other through various linkages 206-216, as well as being connected through linkages 206-210 to port in-board aileron 106 and port out-board aileron 108. Port in-board aileron 106 and port out-board aileron 108 each, respectively, may generate a force that affects lateral control of vehicle 100. Control column 202 and aileron trim control 204 are also connected through linkages 212-216 to starboard in-board aileron 110 and starboard out-board aileron 112. Starboard in-board aileron 110 and starboard out-board aileron 112 each, respectively, may generate a force that affects lateral control of vehicle 100.

Speed brake control 205 may be connected to various linkages 226-232 to control spoiler control valves 234-240 as shown in FIG. 2 to control port in-board spoiler 114, port out-board spoiler 116, starboard in-board spoiler 118, and starboard out-board spoiler 120. Port in-board spoiler 114, port out-board spoiler 116, starboard in-board spoiler 118, and starboard out-board spoiler 120 each, respectively, may generate a force that affects lateral control of vehicle 100.

In some configurations, speed brake control 205 may be connected to various linkages 226-232 to control spoiler control valves 234-240 as described above as well as being connected to linkages 250-252 as shown in FIG. 2 to control port in-board aileron 106 and starboard in-board aileron 110.

One of ordinary skill in the art recognizes that the lines between the numbered components shown in FIG. 2 may be considered as components themselves as well. In other words, without limitation, the lines within FIG. 2 may represent connections between components. Such connections may be without limitation a cable/pulley system that goes throughout vehicle 100. One of ordinary skill in the art recognizes that a component and/or performance variable for such cable connections may include a preload in the cable. One of ordinary skill in the art recognizes that a preload value on a cable may vary to account for temperature effects on the cable, all of which may be modeled through mathematical representations within a model for the system such as without limitation mechanical model 402 interfacing with 6 Degree of Freedom (6-DOF) simulation 416 in vehicle performance processor 408 as discussed further below for FIG. 4.

One of ordinary skill in the art also recognizes that some components may be "connected" wirelessly. Hence, a component and/or performance variable for such for such connections may be electrical in nature. Such electrical component and/or performance variables may be modeled through mathematical representations within a model for the system such as without limitation mechanical model 402, or an associated and communicating electrical model such as without limitation electrical model 406 as presented in FIG. 4.

Similarly, schematics can be made for other systems of a vehicle in motion, such as without limitation vehicle 100, that may interact with, influence, be affected by, and/or combinations thereof with a control system, such as without limitation LCS 104,—or another system—schematic for vehicle 100. As a non-limiting example, a hydraulic system and/or components thereof that interface with and/or power components of LCS 104 may be produced in a similar manner to FIG. 2.

A system schematic, such as without limitation FIG. 2, may be representative of a mechanical model for LCS 104 that can fully model operational features of a system, such as LCS 104 in dynamic operation. Such a model may utilize and resolve equations of motion for at least: hardware components, applied forces on, and resultant forces generated by, mechanical components of LCS 104 and other associated systems that may affect a performance of vehicle 100 and/or of a component thereof.

The illustration of LCS 104 in FIG. 2 is not meant to imply physical or architectural limitations to the manner in which an illustrative example may be implemented. Other components in addition to or in place of the ones illustrated may be used. Some components may be optional. Also, the drawings of elements in FIG. 2 are presented to illustrate some functional components of LCS 104. One of ordinary skill in the art will understand that under some conditions, one or more of these elements may be combined, divided, or combined and divided into different blocks when implemented in an illustrative example. FIG. 2 is not intended to give a detailed or limiting representation of a control system of a vehicle but is provided instead to illustrate a general overview of components and arrangements that may be commonly found in a control system for a vehicle, such as without limitation a lateral control system for an aircraft. One of ordinary skill in the art understands that each component and/or subcomponent of a control system may require detailed design to exacting standards and specifications for a non-limiting variety of elements that may include without limitation dimensions, composition, connections, material properties, and performance limits.

Figure 3:
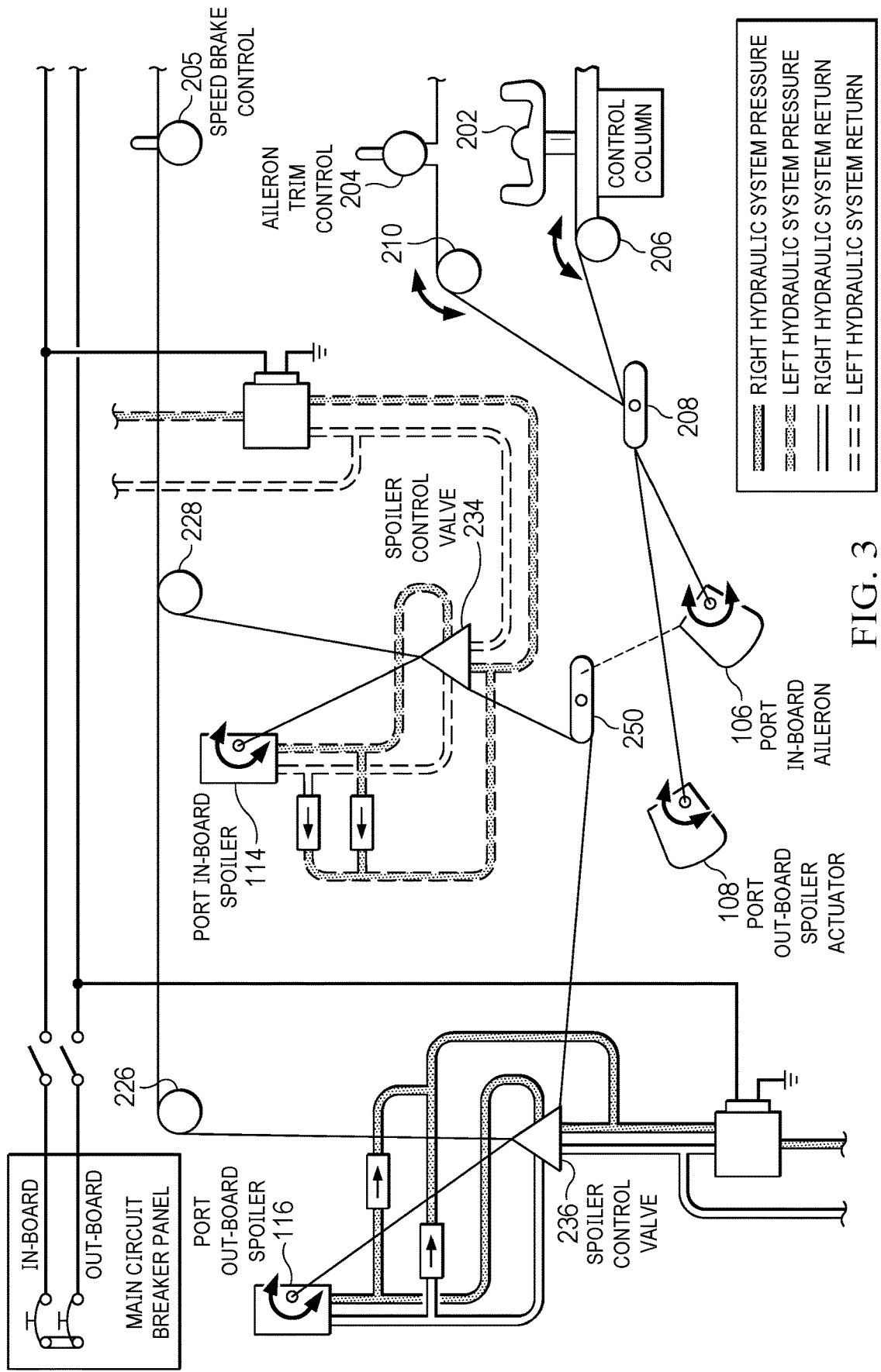
FIG. 3 is an illustration of a plan view of a schematic of a design for a part of a control system depicted in accordance with an illustrative example.

Turning now to FIG. 3, a plan view of a schematic of a design for a part of a control system is depicted in accordance with an illustrative example. FIG. 3 may provide a plan view of a schematic for control system 300 of a design for a small portion of a control system of a vehicle, such as without limitation LCS 104 described in in FIG. 2. FIG. 3 adds hydraulic components interfacing with the mechanical linkages of LCS 104 shown in FIG. 2.

Labeled objects and connections in the schematic shown for control system 300 are not meant to be limiting or exclusive to those labeled in this example of a schematic for a control system such as, without limitation LCS 104, but are provided instead to provide a partial indication of how objects or connections may be represented in a design schematic. Connections may be, without limitation, piping configured to allow travel and that in operation may allow travel of a composition that may be a fluid from one object in control system 300 to another object within or associated with control system 300. Connections may be, without limitation, mechanical and or electrical linkages from one object in control system 300 to another object within or associated with control system 300. Hence, the schematic itself may serve as a plan for manufacture of control system 300, but may lack a functionality for visualization of the system in operation.

From a schematic, such as without limitation, control system 300 illustrated in FIG. 3, a model may be provided for a hydraulic system associated with LCS 104 that may utilize and resolve state equations of hydraulic pressure and flow for at least: hardware components, applied forces on, and resultant forces generated by, components of a hydraulic system and/or other associated systems that may affect the performance of vehicle 100 and/or of a component thereof. As a non-limiting example, U.S. patent application Ser. No. 17/455,028 for MACHINE AND PROCESS TO DESIGN, VALIDATE, AND/OR TEST A FLUID SYSTEM filed Nov. 16, 2021 by The Boeing Company may provide one example of a type of modeling that may be represented by a schematic for a system of vehicle 100, such as without limitation the simplified example of LCS 104 in FIG. 2. Such a model may interface with and/or integrate with a mechanical model for LCS 104 that can fully model operational features of a system, such as LCS 104 in dynamic operation. Such a mechanical model may utilize and resolve equations of motion for at least: hardware components, applied forces on, and resultant forces generated by, mechanical components of LCS 104 and other associated systems that may affect a performance of vehicle 100 and/or of a component thereof.

Figure 4:
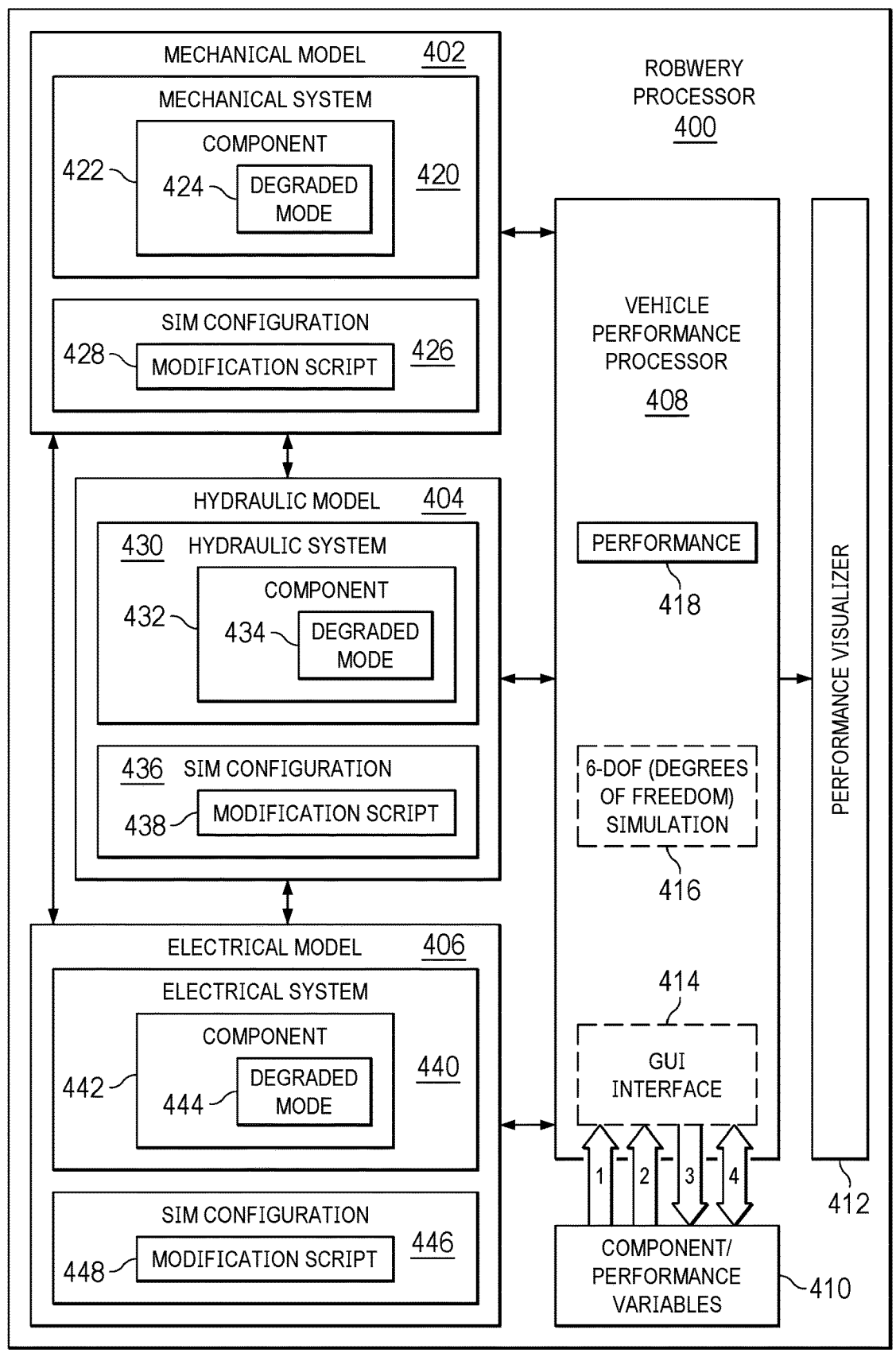
FIG. 4 is an illustration of a block diagram for a machine and process for identifying a component effect on a performance of a vehicle depicted in accordance with an illustrative example.

Turning now to FIG. 4, a block diagram is shown for a machine and process for identifying a component effect on a performance of a vehicle in accordance with an illustrative example. FIG. 4 illustrates a machine and process for integrating a virtualization tool for the design, validation, testing, and monitoring of operations of a control system for a vehicle depicted in accordance with an illustrative example. The collection of elements represented in FIG. 4 forms a novel machine labeled as Robwery processor 400. As shown in FIG. 4, Robwery processor 400 is a novel formal name created for a tool (as for a specific tool such as an Allen wrench or a Phillips-head screwdriver) that may include at least: performance visualizer 412 that may be a visual interface configured to display and that in operation may display outputs from vehicle performance processor 408 that may receive inputs from, without limitation, mechanical model 402, hydraulic model 404, and/or electrical model 406, and component/performance variables 410. Component/performance variables 410 may represent, without limitation, values for characteristics and/or states and/or performance 418 of components and/or sub-components of elements represented in any system models associated with vehicle performance processor 408 as well as any components and/or sub-components of elements manipulated and/or processed thereby.

Each of mechanical model 402, hydraulic model 404, and/or electrical model 406 may represent respectively, mechanical system 420, and a power system that may be at least one of hydraulic system 430 and/or electrical system 440, configured to control and that in operation may control a performance of vehicle 100 as represented in Robwery processor as performance 418. Additionally, without limitation, mechanical model 402, hydraulic model 404, and/or electrical model 406, may each contain at least one respective component 422, component 432, and/or component 442, as a coded representation for at least one component of the respective system on vehicle 100 for respective simulation configuration file 426, simulation configuration file 436, and/or simulation configuration file 446. Each of simulation configuration files may receive respectively modification scripting 428, modification scripting 438, and/or modification scripting 448 that represent a system configured to control and that in operation may control the respective system for, respectively, degraded mode 424, degraded mode 434, and/or degraded mode 444 for the at least respective component of the respective model for the respective system, as shown by FIG. 4. One of skill in the art understands that while shown in the singular in FIG. 4 for ease of illustration, a component may also represent multiple components and/or sub-components. Accordingly, illustration of a singular degraded mode, simulation configuration file, and/or modified scripting, may also be considered as representative of potential multiple thereof.

Scripting for any of the configuration files for any of the systems may be drafted and/or modified at least by inputs through GUI 414 and by changes made to component/performance variables 410 by vehicle performance processor 408 and/or other inputs to GUI 414. GUI 414 may serve a visual interface configured to present and that in operation may present interactive schematics representative of any systems and/or components thereof represented by system models, such as without limitation mechanical model 402, hydraulic model 404, and/or electrical model 406. Without limitation, schematics presented for visualization on GUI 414 may be available for interaction and input and/or adjustment of component/performance variables 410 therefor.

Component/performance variables 410 may also be input to, without limitation, mechanical model 402, hydraulic model 404, and/or electrical model 406. Graphic user interface (GUI) 414 may facilitate input and output of component/performance variables 410 to and from vehicle performance processor 408. Component/performance variables 410 as well as outputs from at least one of mechanical model 402, hydraulic model 404, and/or electrical model 406 may be used by 6-DOF (degrees of freedom) simulation 416 within vehicle performance processor 408 to generate dynamic analysis of vehicle performance and resultant component/performance variables 410 as well as visualization data for performance visualizer 412 presentation of three-dimensional dynamic representation of vehicle performance in operation. Without limitation, elements forming Robwery processor 400 may be assembled in a single physical housing as illustrated in FIG. 4, or may be connected as part of a network and/or system of processor.

Without limitation vehicle performance processor 408 may interface with more models than just mechanical model 402, hydraulic model 404 and/or electrical model 406, for other systems that may affect performance of the vehicle. Without limitation, collections of component and/or performance variables may be input from component/performance variables 410 into vehicle performance processor 408 as a vehicle performance scenario, such as without limitation a preflight scenario for an aircraft. Input of component/performance variables 410 into vehicle performance processor 408 may occur using graphic user interface (GUI) 414. Inputs from GUI 414 may script a model configuration file that may represent and/or may compute a collection of components and/or performance variables representing the vehicle performance scenario that may interface with mechanical model 402, hydraulic model 404, and/or electrical model 406. GUI 414 may provide an interface that allows a user to input and/or modify component and/or performance variables and other scripting within a configuration file within a model. In other words GUI 414 may provide a visual interface for selecting a degraded mode of the selected component within at least of the mechanical system or the power system represented by at least mechanical model 402, hydraulic model 404, and/or electrical model 406.

As shown by FIG. 4, at least mechanical model 402, hydraulic model 404, and/or electrical model 406 may interact and exchange at least component/performance variables 410 with each other. As a non-limiting example, mechanical model 402 may exchange with hydraulic model 404 at least values for deadband, saturation, stiffness variation, and/or fluid dynamic states. As a non-limiting example, mechanical model 402 may exchange with hydraulic model 404 a valve current, a pressure, a flight control surface condition and/or position, and/or a position and/or a velocity of any of, without limitation: a tab lock, a lock lever, an input arm, a cam, a tab damper, and/or a flutter damper.

Similarly, without limitation, mechanical model 402, hydraulic model 404, and/or electrical model 406 may exchange any of the above states and/or component/performance variables 410 between vehicle performance processor 408 and the respective models. Exchange between mechanical model 402, hydraulic model 404, and/or electrical model 406 and vehicle performance processor 408 may include as well, without limitation, a dynamic pressure, an input for a deflection of a control surface of vehicle 100, a movement of a control surface or hinge therefor of vehicle 100, a movement of a tab or a hinge therefor of a control surface of vehicle 100, a position of and/or an angle of a control surface or a tab therefor.

6-DOF simulation 416 may execute a simulation that may utilize inputs from component/performance variables 410 and may interface with mechanical model 402, hydraulic model 404, and/or electrical model 406. GUI 414 may receive and display engineering data and/or plots for component and/or performance variables representing the vehicle performance as inputs or as products of a simulation run by 6-DOF simulation 416. Component and/or performance variables may also be displayed at least as engineering data and/or plots within mechanical model 402, hydraulic model 404, and/or electrical model 406.

6-DOF simulation 416 may compute performance of vehicle based upon mechanical model 402, hydraulic model 404, and/or electrical model 406 and an input from component/performance variables 410 and may provide an output of component and/or performance variables representing the vehicle performance that can be visualized through performance visualizer 412. 6-DOF simulation 416 may include special programming representing control laws for performance of vehicle 100. Without limitation, where vehicle 100 is an aircraft, 6-DOF simulation 416 may include special programming representing flight control laws for the aircraft.

Performance visualizer 412 may output visualization of performance of each component of vehicle 100 in real-time as simulation is being run by 6-DOF simulation 416. Performance visualizer 412 may also save all the data for component and/or performance variables generated by the 6-DOF simulation 416 for analysis and/or replay on performance visualizer 412.

One of ordinary skill in the art recognizes that an ability of performance visualizer 412 to output visualization of performance of each component of vehicle 100 in real-time does not limit processing of the performance to only real-time, or to only visualization of a single component at a time. In other words, without limitation, actual data gathered from, without limitation, a multi-hour operation of vehicle 100 may be loaded into component/performance variables 410 for processing and identification of any degraded component operations by Robwery processor 400 within seconds.

Component variables may include without limitation, for each sub-component and/or of each component respectively of a vehicle: a unique identification, composition, construction and/or performance characteristics, connection and/or function specifics, material, strength, and/or state options. Performance characteristics may include without limitation, pressure, force, flutter, vibration, temperature, shear, stress, capacity, required tolerances and/or reliability, triggers, product requirements, functions, and/or behaviors. In other words, each variable for each component may have data associated with it that may be metadata that may be used by dynamics and/or equations of motion and/or state equations in at least mechanical model 402, hydraulic model 404, electrical model 406, and/or 6-DOF simulation 416.

FIG. 4 is not meant to be a comprehensive or limiting collection of elements that may be created to represent objects in a design and/or operation of a control system for a vehicle. Using the specially programmed software of Robwery Processor 400, a designer can perform critical pre-production verification and/or validation of proper interface and operation of components as depicted in a schematic and translated into a model of a design based upon a value assigned, respectively, for a component and/or performance variables representing the vehicle performance. Using the specially programmed software of Robwery Processor 400, at least a designer and/or maintainer can perform operational analysis of components of a vehicle in operation based upon actual measured component and/or performance variables captured during actual operation of the vehicle.

Figure 5:
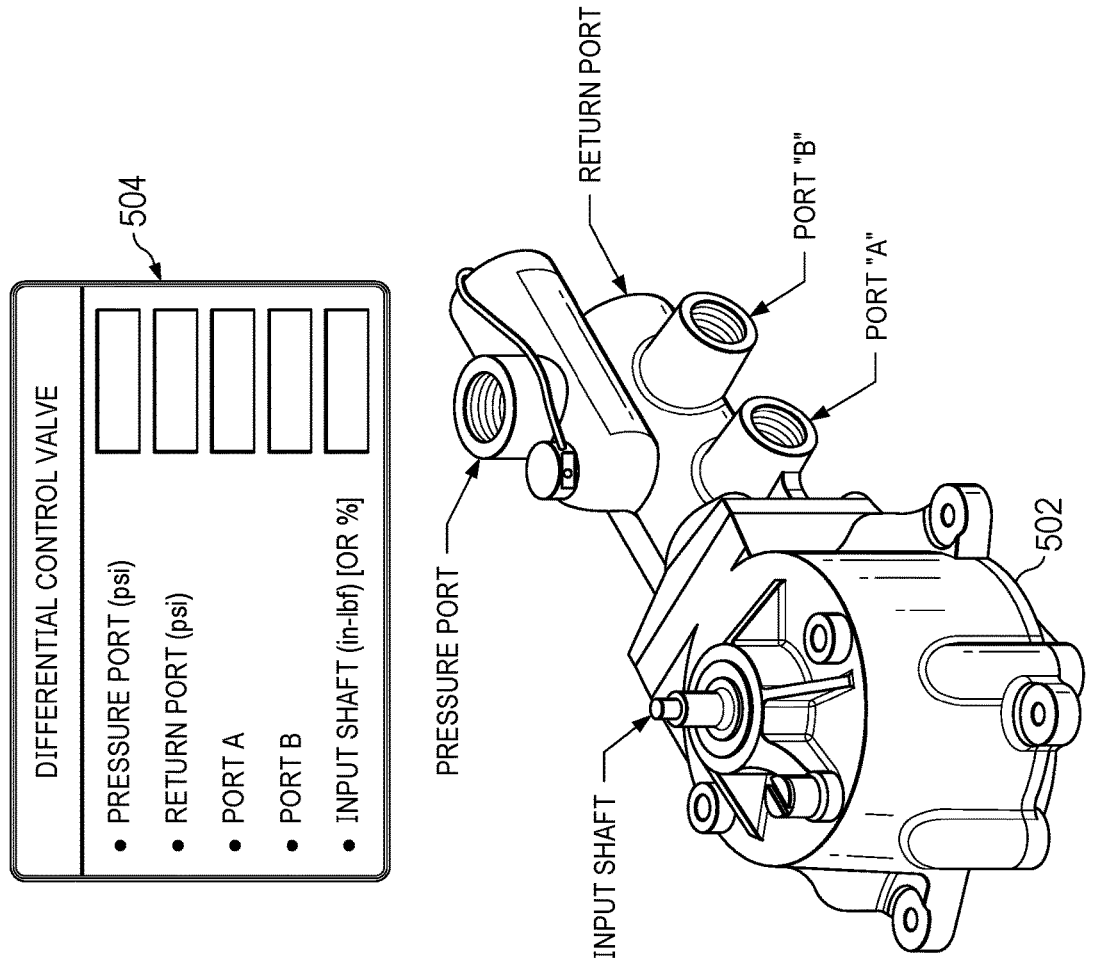
FIG. 5 is an illustration of a model, a component image, and a component variable menu associated with a Robwery processor depicted in accordance with an illustrative example
Figure 5:
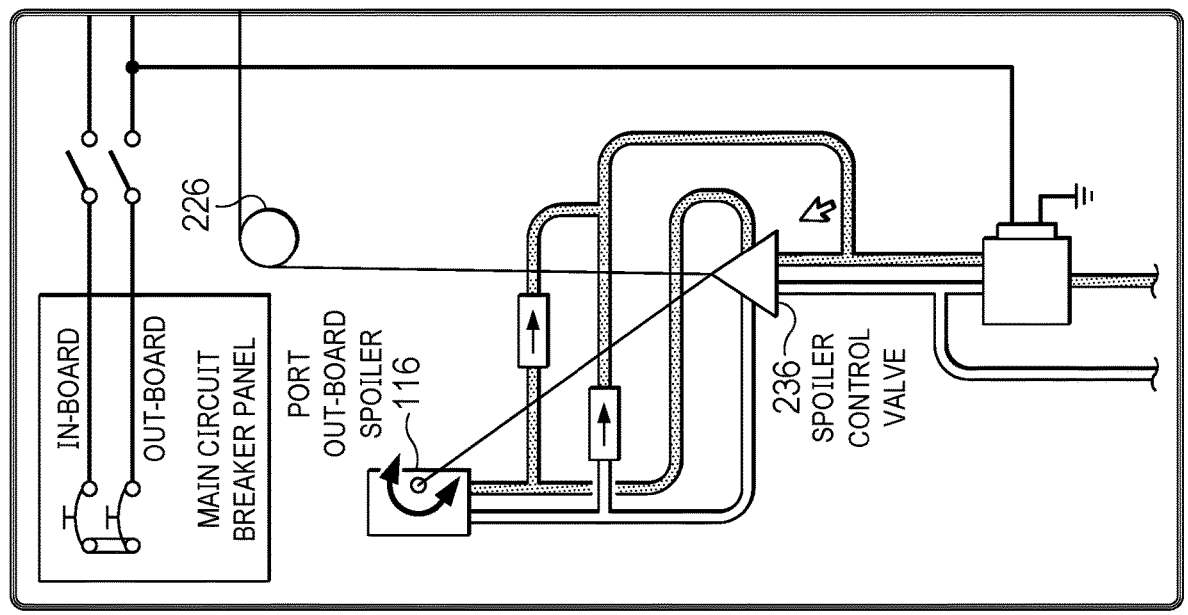

Now looking to FIG. 5, an illustration of a model, a component image, and a component variable menu associated with a Robwery processor is depicted in accordance with an illustrative example. As a non-limiting example, any element in schematic/model for mechanical model 402, hydraulic model 404, and/or electrical model 406 for a vehicle, such as without limitation vehicle 100, may be designated by vehicle performance processor 408. Designation of an item in any of models associated with vehicle performance processor 408 may be made through GUI 414 of vehicle performance processor 408. Designation of an element by vehicle performance processor 408 may present selected component and all related component and performance variables as an image and a menu on GUI 414.

As shown in FIG. 5, image 502 shown on GUI 414 may be, without limitation, of a component selected in hydraulic model 404, such as without limitation spoiler control valve 236 shown in FIG. 2 and FIG. 4. Image 502, without limitation, may be a pop-up display that may show subcomponents of selected component that have measurable and/or adjustable variables, and menu 504 may present current values for those variables in component/performance variables 410 associated with the selected component, and/or subcomponents thereof.

GUI 414 for vehicle performance processor 408 may be used to view and/or to set a value for each variable presented in menu 504. In other words, as shown in FIG. 5, a value may be observed and/or designated for each of a Pressure Port, a Return port, a Port A, a Port B, and/or an Input Shaft of spoiler control valve 236.

Hence, Robwery Processor 400 may provide for a novel process for a real time simulation of a full performance for a vehicle and components thereof based upon input desired or actual values of variables for each component based upon models that interface the effects of all the components of each model associated with vehicle performance processor 408. A simulation program of 6-DOF simulation 416 may provide a dynamic output of values for each variable associated with a component and/or a performance thereof in real time, or in a post-operational review, through GUI 414 while presenting a three-dimensional representation of the vehicle's performance on performance visualizer 412.

Performance visualizer 412 may provide a quality oversight with the ability to visually track, among others, operations that are critical and/or require high precision and reliability, and intervene when undesired elements and/or undesired performance become evident. Thereby, the novel machine and process illustrated herein allow a control system to be designed, validated, and provide novel analysis capability for maintenance in a virtual environment. Such novel capability may provide and improvement to existing technology in processing data to analyze design and operation of performance of a vehicle and/or systems thereof in operation, that can recognize and greatly reduce and/or eliminate human error in the development, design, review, maintenance, and/or operation of the vehicle and/or component thereof. Thereby by first time quality, reliability, and precision, of the design, development, analysis, testing, operations, maintenance and execution of a system for a vehicle in motion is provided. Without limitation, the vehicle may be an aircraft in flight.

In other words, Robwery Processor 400 may provide for selecting, using GUI 414, a sub-component and/or component and/or multiples thereof for vehicle 100 to initiate a pop-up display image 502 of selected sub-component and/or component and/or multiples thereof and menu 504 for component/performance variables 410 therefor, and viewing data, and/or adjusting values of component/performance variables 410. Vehicle performance processor is specially programed to save selections and apply them throughout 6-DOF simulation 416 and associated models that may include, without limitation, mechanical model 402, hydraulic model 404, and/or electrical model 406. 6-DOF simulation 416 may run a simulation for a performance by vehicle 100. During and/or after 6-DOF simulation 416 running the simulation for a performance by vehicle 100, GUI 414 may be used to select a desired sub-component and/or component and/or multiples thereof for vehicle 100 and see resulting component/performance variables 410 values therefor. A kinematic dynamic demonstration of the simulation may be presented and viewed using performance visualizer 412 during and/or after running the simulation for a performance by vehicle 100.

Figure 6:
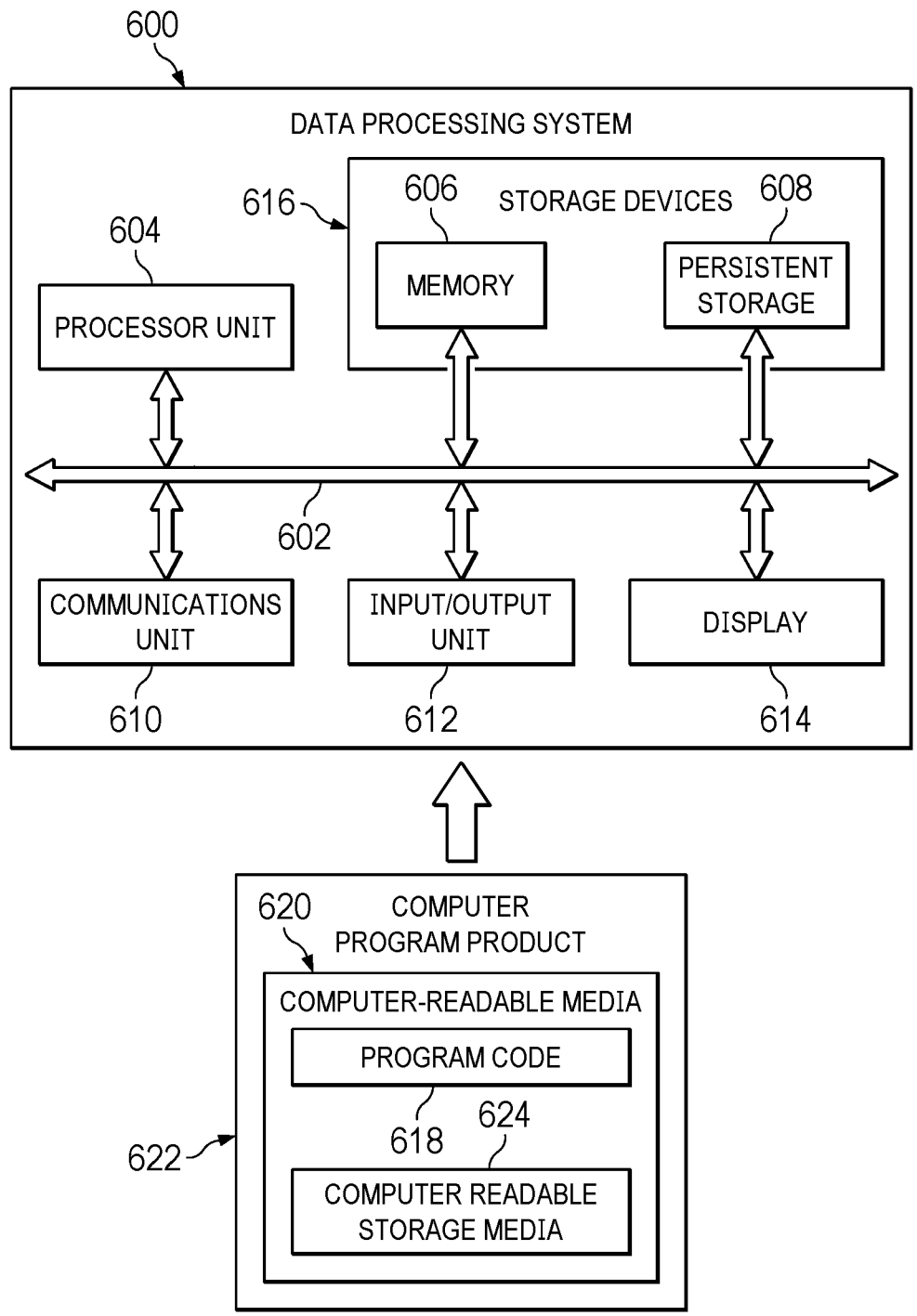
FIG. 6 is an illustration of a block diagram of a data processing system depicted in accordance with an illustrative example.

Turning now to FIG. 6, an illustration of a block diagram of a data processing system is depicted in accordance with an illustrative example. Data processing system 600 can be used to implement one or more data processing systems for vehicle 100 in FIG. 1. Thus, without limitation, data processing system 600 may describe at least Robwery Processor 400, mechanical model 402, hydraulic model 404, electrical model 406, vehicle performance processor 408, the processor managing component/performance variables 410, performance visualizer 412, the processor controlling graphic user interface (GUI) 414, and/or 6-DOF simulation 416, and/or combinations and/or association therewith. In this illustrative example, data processing system 600 may include communications framework 602, which may provide communications between processor unit 604, memory 606, persistent storage 608, communications unit 610, input/output (I/O) unit 612, and display 614. In this example, without limitation, communications framework 602 may take the form of a bus system, such as, without limitation, a data bus.

Processor unit 604 may serve to execute instructions for software that can be loaded into memory 606. Processor unit 604 one or more processors. For example, and without limitation, processor unit 604 can be selected from at least one of: a multicore processor, a central processing unit (CPU), a graphics processing unit (GPU), a physics processing unit (PPU), a digital signal processor (DSP), a data concentrator, a network processor, or some other suitable type of processor.

Memory 606 and persistent storage 608 are examples of storage devices 616. A storage device is any piece of hardware that is capable of storing information, such as, for example, and without limitation, at least one of: data, program code in functional form, or other suitable information either on a temporary basis, a permanent basis, or both on a temporary basis and a permanent basis. Storage devices 616 may also be referred to as computer-readable storage devices in these illustrative examples. Memory 606, in these examples, can be without limitation, for example, a random-access memory or any other suitable volatile or non-volatile storage device. Persistent storage 608 can take various forms, depending on the particular implementation.

For example, persistent storage 608 may contain one or more components or devices. For example, persistent storage 608 can be without limitation at least one of: a hard drive, a solid-state drive (SSD), a flash memory, a rewritable optical disk, a rewritable magnetic tape, or some combination of the above. The media used by persistent storage 608 also can be removable. Such as, a removable hard drive can be used for persistent storage 608.

Communications unit 610, in these illustrative examples, may provide for communications with other data processing systems or devices. Communications with other data processing systems or devices may include transformation to other data formats and protocols connected to communications unit 610. Without limitation, communications unit 610 may be a network interface card.

Input/output unit 612 allows for input and output of data with other devices that can be connected to data processing system 600. For example, functions of GUI 414 may be represented by input/output unit 612 that can provide a connection for user input through at least one of: a keyboard, a mouse, or some other suitable input device. Further, input/output unit 612 can send output to a printer. Display 614 may provide a mechanism to display information to a user. Program manipulators may include display 614.

Instructions, or rules, for at least one of the operating system, applications, or programs can be located in storage devices 616, which are in communication with processor unit 604 through communications framework 602. The processes of the different examples can be performed by processor unit 604 using computer-implemented instructions, which can be located in a memory, such as memory 606. For example, a process may be performed by Robwery processor 400 in FIG. 4 and computer program product 622 in FIG. 6 can be implemented as instructions in program code 618.

These instructions may be referred to as program code 618, or alternatively referred to as: specially programmed code, computer usable program code, or computer-readable program code that can be read and executed by a processor in processor unit 604. The program code in the different examples can be embodied on different physical or computer-readable storage media, such as memory 606 or persistent storage 608.

Program code 618 is located in a functional form on computer-readable media 620 that is selectively removable and can be loaded onto or transferred to data processing system 600 for execution by processor unit 604 and/or communications unit 610. Program code 618 and computer-readable media 620 form computer program product 622 in these illustrative examples. In the illustrative example, computer-readable media 620 is computer-readable storage media 624.

In these illustrative examples, computer-readable storage media 624 is a physical or tangible storage device used to store program code 618 rather than a medium that may propagate and/or may transmit program code 618.

Alternatively, program code 618 can be transferred to data processing system 600 using a computer-readable signal media. The computer-readable signal media can be, for example, a propagated data signal containing program code 618, which can be at least one of an electromagnetic signal, an optical signal, or any other suitable type of signal. These signals can be transmitted over connections, such as wireless connections, optical fiber cable, coaxial cable, a wire, or any other suitable type of connection.

The different components illustrated for data processing system 600 are not meant to provide architectural limitations to the manner in which different examples can be implemented. In some illustrative examples, one or more of the components may be incorporated in or otherwise form a portion of, another component. For example, memory 606, or portions thereof, can be incorporated in processor unit 604 in some illustrative examples. The different illustrative examples can be implemented in a data processing system including components in addition to or in place of those illustrated for data processing system 600. Other components shown in FIG. 6 can be varied from the illustrative examples shown. The different examples can be implemented using any hardware device or system capable of running program code 618.

Further, Robwery processor 400 can be configured to perform and that in operation may present at least one of the steps, operations, or actions described in the different illustrative examples using software, hardware, firmware, or a combination thereof. As a result, Robwery processor 400 may operate as a specially programmed special purpose computer system for at least one of design, analysis, and or maintenance for a performance of vehicle 100.

In particular, special coding in components of Robwery processor 400 transform Robwery processor 400 into a special purpose computer system as compared to currently available general computer systems that do not have at least the components of Robwery processor 400 as shown in FIG. 4. In illustrative examples herein, Robwery processor 400 integrates various processes of the several elements of Robwery processor 400 into a practical application for analyzing the performance of vehicle 100 may provide novel and enhanced processes for analyzing performance and directing maintenance for vehicle 100. In other words, Robwery processor 400 is directed to a practical application of processes integrated into Robwery processor 400 that affords novel detailed analytics for vehicle 100. These processes result in improvement in the operation of vehicle 100. Robwery processor 400 may operate with increased precision, detail, predictive and visualization capabilities and efficiency as compared to current systems for analysis and maintenance diagnostics for a performance of a vehicle, and/or for a component and/or a collection of components thereof. In this manner, Robwery processor 400 may provide a practical application of providing analysis and directing maintenance for a vehicle, and/or for a component and/or a collection of components thereof.

As used herein, "at least one of," when used with a list of items, means different combinations of one or more of the listed items may be used and only one of each item in the list may be needed. For example, "at least one of item A, item B, or item C" may include, without limitation, item A, item A and item B, or item B. This example also may include item A, item B, and item C or item B and item C. Of course, any combinations of these items may be present. In other examples, "at least one of" may be, for example, without limitation, two of item A; one of item B; and ten of item C; four of item B and seven of item C; or other suitable combinations. The item may be a particular object, thing, or a category. In other words, at least one of means any combination items and number of items may be used from the list but not all of the items in the list are required.

Figure 7:
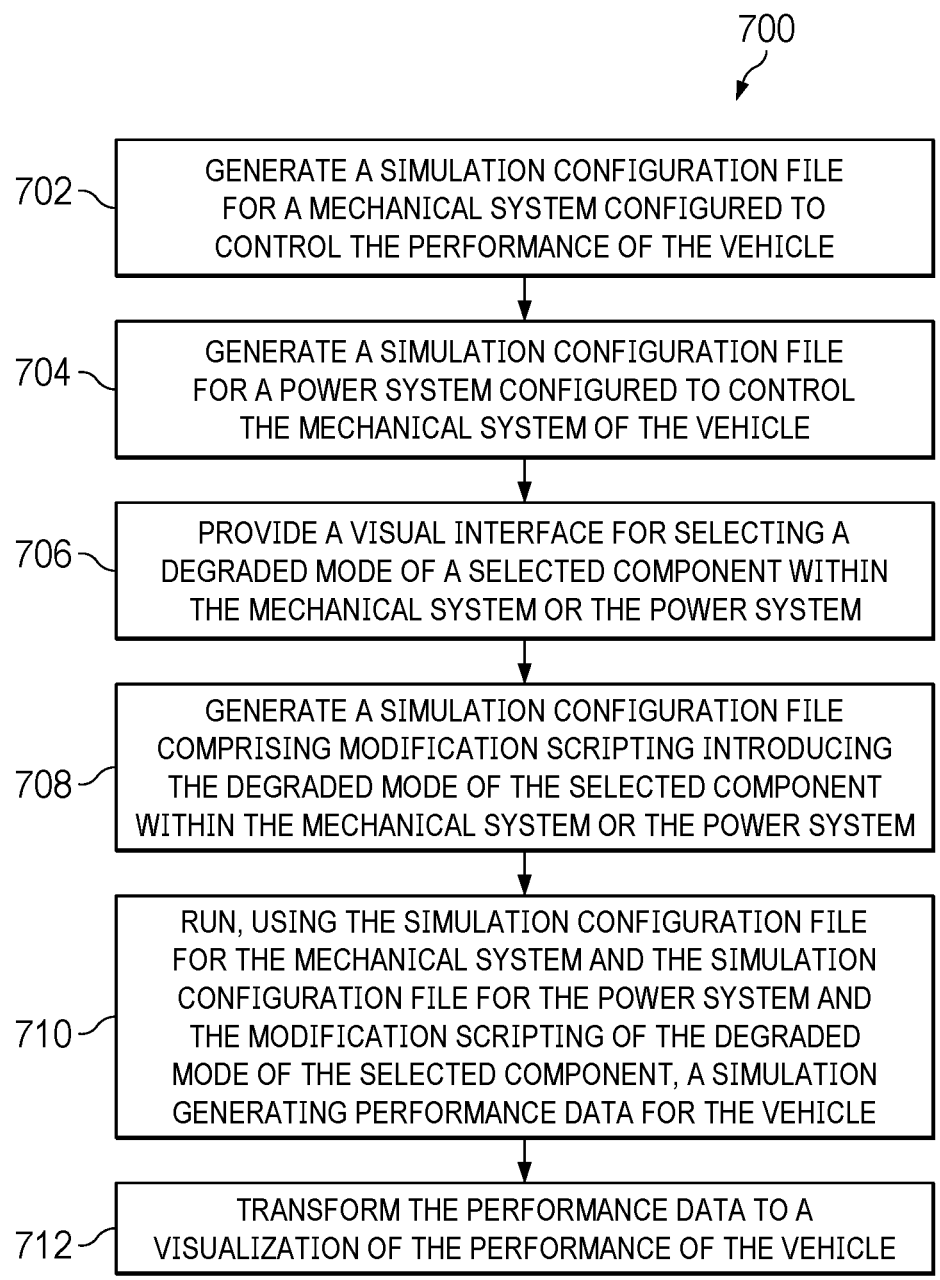
FIG. 7 is a flowchart of a process for identifying a component effect on a performance of a vehicle depicted in accordance with an illustrative example.

Turning now to FIG. 7, a flowchart is shown of a process for identifying a component effect on a performance of a vehicle in accordance with an illustrative example. More specifically, process 700 shown in FIG. 7 for identifying a component effect on a performance of a vehicle may begin with initializing a model for a vehicle performance simulation at least by generating a simulation configuration file for a mechanical system configured to control and that in operation may control the performance of the vehicle (operation 702). Without limitation, a mechanical system may be represented by mechanical model 402 shown in FIG. 4. Mechanical model 402 may comprise a simulation configuration file representing the mechanical system. Generating the simulation configuration file within mechanical model 402 may be based on inputs for components/performance variables 410 loaded as a part of a vehicle performance scenario through GUI 414 of vehicle performance processor 408. As shown in FIG. 4, GUI 414 is within vehicle performance processor 408. One of ordinary skill in the art recognizes that the relationship represented in FIG. 4 may be functional as well if GUI 414 is physically separated but in communication with vehicle performance processor 408.

Process 700 may also include generating a simulation configuration file for a power system configured to control and that in operation may control the mechanical system of the vehicle (operation 704). Without limitation, hydraulic model 404 and/or electrical model 406 may represent the power system configured to control and that in operation may control the mechanical system of the vehicle. Likewise, as mentioned above, one of ordinary skill in the art recognizes that other models may be associated with Robwery processor 400 to represent other methods of power affecting a control system and performance of a vehicle and/or components thereof. Without limitation, one such system could be a pneumatic system, a radiant energy system, and/or a nuclear system. Generating the simulation configuration file may be based on inputs for components/performance variables 410 loaded as a part of a vehicle performance scenario through GUI 414 of vehicle performance processor 408.

Running performance processor 408 with all values for component/performance variables 410 input being in a normal expected operational range, and all components and subcomponents represented in associated models being assigned variables for a fully operational non-degraded mode of operation will result in output results for all the performance variables for operation of the vehicle being in an expected and normal operational range. Output results from performance processor 408 for all the performance variables for operation of the vehicle may be presented on GUI 414. Likewise, three-dimensional presentation of operation of the vehicle on performance visualizer 412 would indicate no irregularities, anomalies, or undesired control issues. Output results may include, without limitation, updated values for all the variables for performance and each component from original inputs. Output results may also include at least a position and/or status for each mechanism of the control system for the vehicle and/or components thereof. Without limitation, output results may include values for angles, displacements, forces, rotation, etc. of each mechanism and/or parts thereof measured for the control system of the vehicle. Likewise performance variables for the vehicle and/or components thereof may be included in output results.

Process 700 may continue by providing a visual interface for selecting the degraded mode of the selected component within the mechanical system or the power system (operation 706). Without limitation, GUI 414 may be used to introduce a value that represents some type of degraded mode for one or more selected component of the vehicle, such as without limitation a component and/or subcomponent within mechanical model 402, hydraulic model 404 and/or electrical model 406. Without limitation, examples of a degraded mode may include at least changes to interfaces of mechanical components, such as a deletion of a cable system, and/or adding mechanical slop to an attachment interface. Without limitation, examples of a degraded mode may include at least changes to a portion of a power systems, such as an undesired hydraulic pressure, and/or a failed check valve.

Process 700 may continue by generating a simulation configuration file comprising modification scripting introducing a degraded mode of a selected component within the mechanical system or the power system (operation 708). Generating the simulation configuration file may be based on inputs for components/performance variables 410 loaded as a part of a vehicle performance scenario through GUI 414 of vehicle performance processor 408. Process 700 may continue by running, using the configuration file for the mechanical system and the configuration file for the power system and the modification scripting of the degraded mode of the selected component, a simulation generating performance data for the vehicle (operation 710). In other words, GUI 414 may receive values for component/performance variables 410 that represent a degraded mode for a selected component of mechanical model 402, hydraulic model 404 and/or electrical model 406 that is applied into 6-DOF simulation 416 run by vehicle performance processor 408.

In addition, process 700 may complete with transforming the performance data to a visualization of the performance of the vehicle (operation 712). In other words, without limitation, output results from simulation may be presented in GUI 414 as data in an output results menu filled with values for any selected component/performance variables 410, or in a graphic, tabular, or other format useful to at least engineers and/or mechanics evaluating a performance of the vehicle and or components thereof, as well as producing a full three-dimensional visualization of performance of the vehicle and/or components thereof through performance visualizer 412. Output results and visualization are also saved by Robwery processor 400 for future review and analysis.

At least in process 700, the performance being simulated may be a performance of a vehicle moving in a fluid. The fluid may be air. The vehicle may be an aircraft.

The mechanical system of process 700 may include: mechanical components, and mechanical dynamics comprising: applied forces and resultant forces on the mechanical components in a fluid flow. Further, the mechanical system may include a flight control linkage for an aircraft. The flight control linkage may be for lateral control of an aircraft. The flight control linkage may be for control about any axis of an aircraft.

The performance data of process 700 may include values for variables that represent: a position of a tracked component within mechanical system or the power system, forces upon and forces generated by the tracked component within the mechanical system or the power system, and a position and a motion of the vehicle. The performance data of process 700 may, without limitation, include values for variables that represent: a position of a tracked component within mechanical system or the power system, forces upon and forces generated by the tracked component within the mechanical system or the power system, and a pitch, a roll, a yaw, a pitch rate, a roll rate, a yaw rate, a velocity, an acceleration, and a loading upon an aircraft.

At least in process 700, the visual interface for selecting the degraded mode of the selected component may include a graphical user interface presenting a schematic of: the mechanical system, or the power system. The interface presenting a schematic of: the mechanical system, or the power system may be configured for receiving a selection of the selected component presented on the schematic.

At least in process 700, translating the performance data to a visualization may include using six degrees of freedom equations of motion for generating an output to a user interface that may provide a three-dimensional representation of the vehicle in motion over a period of time. Translating the performance data to a visualization may produce; a graphical presentation, and a data table presentation, of a performance, respectively, of: the power system, the mechanical system, and the vehicle, in three dimensions.

At least in process 700, the degraded mode may be selectable from a complete failure of the selected component through a range of less than full capability of the selected component. Hence, one of ordinary skill in the art recognizes design and maintenance analysis benefits from process 700 executed by Robwery processor 400 whereby when any particular performance is recorded or observed for a vehicle or a component thereof in actual operation, that a suspected cause of that performance may be evaluated by selecting a degraded mode of some component or subcomponent of the vehicle for input to vehicle performance processor 408 and/or a model of a system associated therewith.

In other words, once a degraded mode/defect for a component of component/performance variables 410 is set through GUI 414 it may be saved and applied and calculated/processed throughout the dynamic/kinematic representation of a performance for vehicle 100 computed and represented through the operation and interfacing of specially programed coding in models for systems of vehicle 100 and 6-DOF simulation 416 of vehicle performance processor 408. Using performance visualizer 412 and/or GUI 414, results of values for component/performance variables 410 from running the 6-DOF simulation 416 may be selected for viewing and analysis for any desired component represented for vehicle 100. Hence, simulation configuration files for, without limitation 6-DOF simulation 416 of vehicle performance processor 408 and without limitation mechanical model 402, hydraulic model 404 and/or electrical model 406 interfacing therewith may be generated and run in 6-DOF simulation 416 for a desired configuration of vehicle 100. Desired configuration may be a nominal configuration. Nominal configuration may include expected/design values for component/performance variables 410. Simulation configuration files for, without limitation 6-DOF simulation 416 of vehicle performance processor 408 and without limitation mechanical model 402, hydraulic model 404 and/or electrical model 406 interfacing therewith may also be modified to input a degraded mode of a component of vehicle 100 during a simulation of performance of vehicle 100. Degraded mode may be input through GUI 414 as desired, or actual values recorded for component/performance variables 410 received in real-time and/or recorded from an actual performance of vehicle 100 may be input.

Hence, Robwery processor 400 may be used to analyze an effect of any degraded mode for a component that is a known input, or to analyze and/or identify a component actually performing on vehicle 100 in a degraded mode. GUI 414 may be used to assist selection of and presentation formats for individual or groups of sub-component, component, or systems of vehicle 100.

Figure 8:
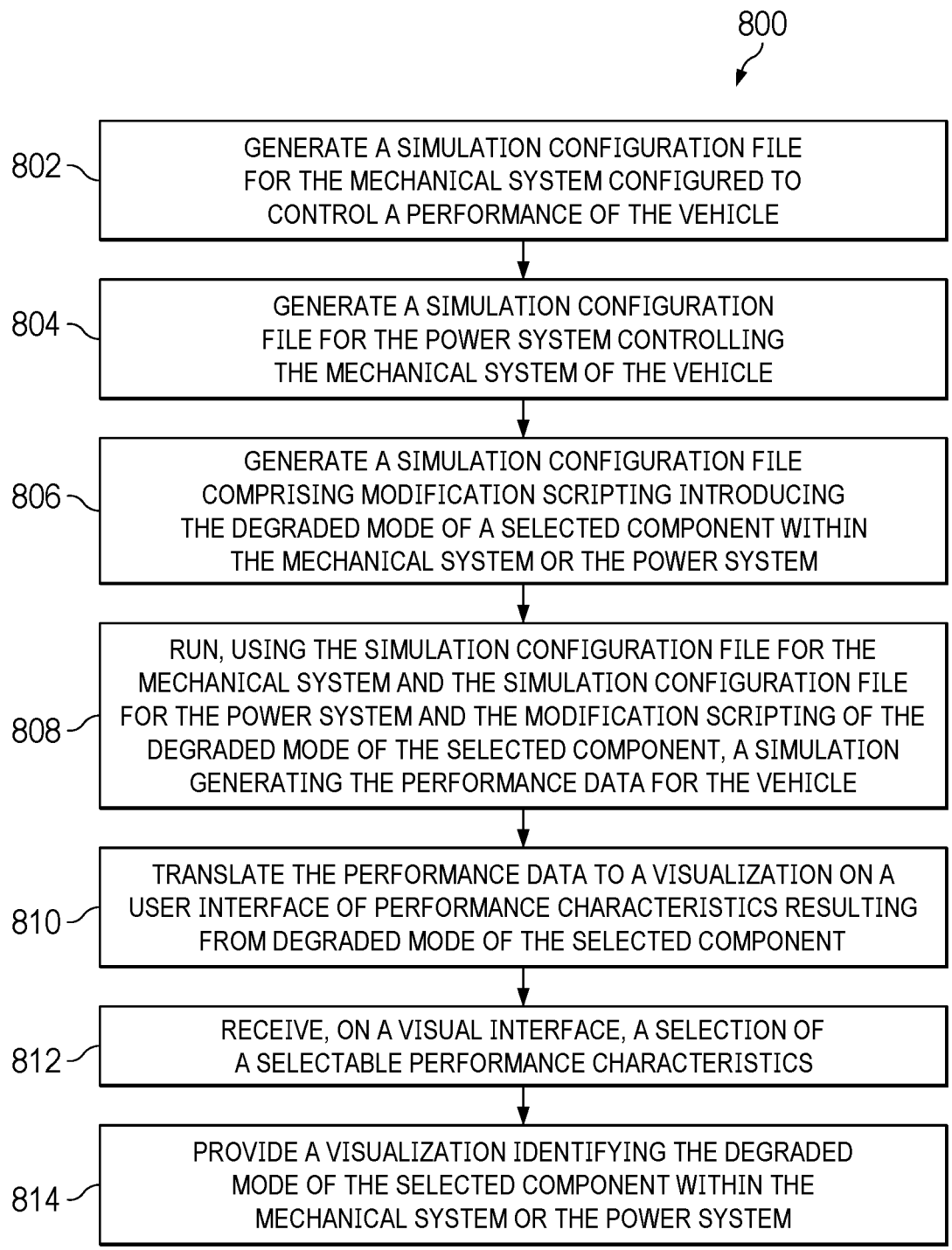
FIG. 8 is a flowchart of a process for predicting a consequence of a single point failure in a mechanical system of a vehicle on a performance of the vehicle depicted in accordance with an illustrative example.

Turning now to FIG. 8, a flowchart is shown of a process for predicting a consequence of a single point failure in a mechanical system of a vehicle on a performance of the vehicle in accordance with an illustrative example. It follows from descriptions above that during or after Robwery processor 400 and vehicle performance processor 408 running the modification scripting of the degraded mode of the selected component in simulation, the output results of the simulation as well as a three-dimensional visualization of the performance may be viewed to determine if the degraded component caused the particular performance of the vehicle. Thus, without limitation process 800 for predicting a consequence of a single point failure in a mechanical system of a vehicle on a performance of the vehicle may begin with generating a simulation configuration file for a mechanical system configured to control and that in operation may control the performance of the vehicle (operation 802).

At least process 800 may also include generating a simulation configuration file for a power system controlling the mechanical system of the vehicle (operation 804). Process 800 may include generating a simulation configuration file comprising modification scripting introducing the degraded mode of a selected component within the mechanical system or the power system (operation 806). One of ordinary skill in the art understands that a degraded mode may include degradations up to and including a total failure of the component. Hence, for any system being evaluated by Robwery processor 400, a single point failure within the system may be identified and/or analyzed using Robwery processor 400 as a degraded mode of operation of a component within the system.

Further, process 800 may include running, using the configuration file for the mechanical system and the configuration file for the power system and the modification scripting of the degraded mode of the selected component, a simulation generating performance data for the vehicle (operation 808).

At least process 800 may also include translating the performance data to a visualization on a user interface of performance characteristics resulting from degraded mode of the selected component (operation 810). Process 800 may continue by receiving, on a visual interface, a selection of the selectable performance characteristics (operation 812). Process 800 may also include providing a visualization identifying the degraded mode of the selected component within the mechanical system or the power system (operation 814).

As a more specific but non-limiting example, if an aileron trim tab of an aircraft were observed moving uncontrollably during flight and possibly generating undesired forces on the lateral control of the aircraft, a maintenance technician or currently existing trouble shooting guide might suspect an equal probability that a control rod within the wing connected to the trim tab is disconnected, a hydraulic control of the control rod might be leaking or malfunctioning, and/or an electronic control unit for the hydraulic control unit might be having a phase or shorting error. Each option might require different skills, tools, and/or parts to address. Those skills, tools, and/or parts may not be available at a present location of the aircraft. Each repair choice may take significantly different amounts of disassembly for access and time to complete the repair.

With the novel technological advantage of Robwery processor 400 a simulation might be run with parameters matching the conditions of the aircraft in flight at the time of the uncontrollable tab motions were observed and a variable in the simulation representing a control rod for the aileron trim tab assigned a degraded mode value representing the control rod as being disconnected. If the observed uncontrolled motions of the tab are not presented in output results from the simulation and/or are not apparent in the three-dimensional visualization of the aircraft in flight on performance visualizer 412, the control rod can be ruled out a single source of the undesired performance. Additional simulations can be run for each of the other potential causes, or for combinations thereof, or for any desired component of the aircraft by selecting a degraded mode of the selected component(s) within the mechanical system or the power system, or other associated systems of the vehicle represented by models associated with the vehicle performance processor.

One of ordinary skill in the art recognizes that while FIG. 8 discusses the principles, processes, and machine for identifying a single point failure or a degraded mode of a component, Robwery Processor 400 and processes executed thereby may be equally applied to simultaneous and or sequential failures or degradations of more than just one component or subcomponent on a performance of vehicle 100.

Figure 9:
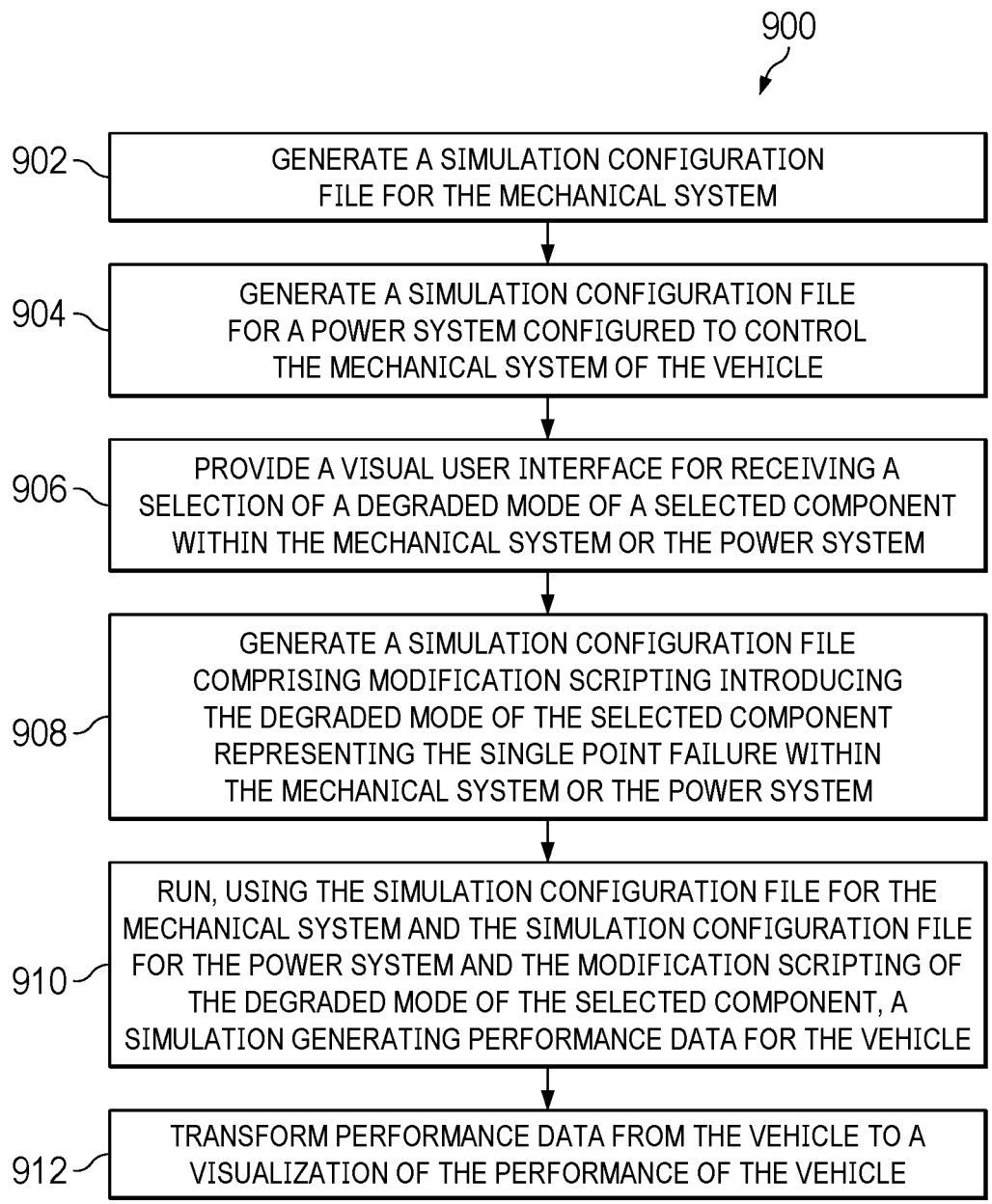
FIG. 9 is a flowchart of a process for predicting a consequence of a single point failure in a mechanical system of a vehicle on a performance of the vehicle depicted in accordance with an illustrative example.

Robwery processer 400 may also execute other processes. Turning now to FIG. 9, a flowchart is shown of a process for predicting a consequence of a single point failure in a mechanical system of a vehicle on a performance of the vehicle in accordance with an illustrative example. Process 900 for predicting a consequence of a single point failure in a mechanical system of a vehicle on a performance of the vehicle as illustrated in FIG. 9 may begin with generating a simulation configuration file for a mechanical system configured to control and that in operation may control a performance of the vehicle (operation 902).

Process 900 may also include generating a simulation configuration file for a power system configured to control and that in operation may control the mechanical system of the vehicle (operation 904), as well as providing a visual user interface for receiving a selection of the degraded mode of the selected component within the mechanical system or the power system (operation 906). Process 900 may also include generating a simulation configuration file comprising modification scripting introducing a degraded mode of a selected component representing the single point failure within the mechanical system or the power system (operation 908).

Process 900 may continue by running, using the configuration file for the mechanical system and the configuration file for the power system and the modification scripting of the degraded mode of the selected component, a simulation generating performance data for the vehicle (operation 910). Without limitation, process 900 may terminate by transforming the performance data to a visualization of the performance of the vehicle (operation 912).

Process 900 may be further expanded by running, using the configuration file for the mechanical system and the configuration file for the power system and the modification scripting of a degraded mode of every component of the mechanical system and the power system, a simulation generating performance data for the vehicle. Likewise, process 900 may be expanded by storing the performance data in a format rapidly accessible based upon at least each of: forces upon and forces generated by each component within the mechanical system or the power system, and a pitch, a roll, a yaw, a pitch rate, a roll rate, a yaw rate, a velocity, an acceleration, and a loading upon an aircraft.

Figure 10:
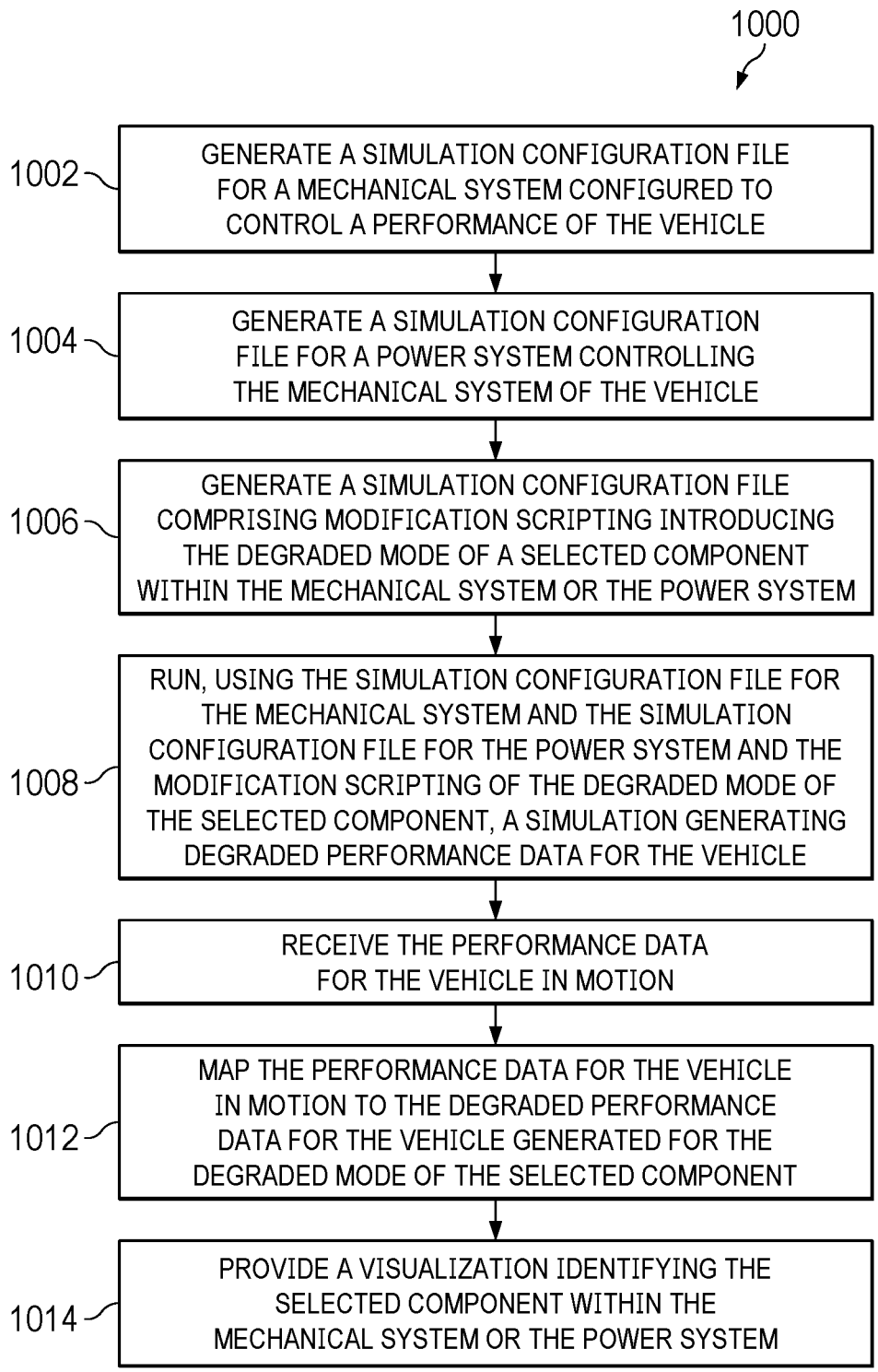
FIG. 10 is an illustration of a flowchart of a process for identifying, using performance data from a vehicle in motion, a degraded mode for a component on the vehicle in motion in accordance with an illustrated example.

Turning now to FIG. 10, a flowchart is shown of a process for identifying, using performance data from a vehicle in motion, a degraded mode for a component on the vehicle in motion in accordance with an illustrative example. Process 1000 for identifying, using performance data from a vehicle in motion, a degraded mode for a component on the vehicle in motion may begin by generating a simulation configuration file for a mechanical system configured to control and that in operation may control the performance of the vehicle (operation 1002). Process 1000 may continue by generating a simulation configuration file for a power system controlling the mechanical system of the vehicle (operation 1004).

At least process 1000 may also include generating a simulation configuration file comprising modification scripting introducing a degraded mode of a selected component within the mechanical system or the power system (operation 1006). Process 1000 may further include running, using the configuration file for the mechanical system and the configuration file for the power system and the modification scripting of the degraded mode of the selected component, a simulation generating performance data for the vehicle (operation 1008).

At least process 1000 may also include receiving performance data for the vehicle in motion (operation 1010). Process 1000 may include as well, mapping the performance data for the vehicle in motion to performance data for the vehicle generated for the degraded mode of the selected component (operation 1012). Without limitation, process 1000 may terminate by providing a visualization identifying the selected component within the mechanical system or the power system (operation 1014). Thus, Robwery processor 400 has algorithms of specially programed code that provide a technological improvement over previous analysis of a performance of a vehicle and visualization systems therefor at least in providing the machine and process whereby an effect of a degradation of a particular component of the vehicle may be identified and visualized.

Special programming for Robwery processor 400 may improve visualization technology for a performance of a vehicle and components thereof by allowing a rollback to a desired previous condition in a runtime of a simulation by 6-DOF simulation 416 of operations representing actual performance of a vehicle, such as without limitation vehicle 100. Thereby, if any undesired or unintended change or outcome become apparent on performance visualizer 412 during a simulation, the simulation may be halted, a change made to a value of a component/performance variable and the simulation restarted. Thereby, a full reset or new session for the simulation is not required and may be avoided. Thereby, design, validation, and/or maintenance analysis and repairs time and expense may be reduced.

In other words, Robwery processor 400 may provide a novel machine specially programed to provide a novel technological advantage to initialize, execute, and process simulations of component effects upon a performance of a vehicle. More specifically, GUI 414 may provide for initializing a configuration and/or performance scenario in vehicle performance processor 408 creating configuration files for models representing systems of a vehicle, such as without limitation, vehicle 100. Configuration files for the models and/or performance scenarios may be modified through inputs received by vehicle performance processor 408 at least through GUI 414. Functional model unit communication protocol may facilitate interfacing at least between GUI 414 and models for systems for vehicle 100, such as without limitation mechanical model 402, hydraulic model 404 and/or electrical model 406. In other words, 6-DOF simulation 416 may be said to invoke performance visualizer 412 to instantiate a model for at least one system for vehicle 100, such as without limitation, mechanical model 402, hydraulic model 404 and/or electrical model 406, Inputs of component/performance variables to vehicle performance processor 408 may be from actual values received in real-time and/or recorded from actual performance of vehicle 100. Inputs received of component/performance variables 410 to vehicle performance processor 408 may be of nominal, design, and/or desired values input for analysis. Vehicle performance processor 408 may run simulation in real-time, and/or with accelerated processing for performance of vehicle 100 and save resultant values for processed component/performance variables 410. Vehicle performance processor 408 may provide saved processed resultant values for component/performance variables 410 for visualization and analysis on performance visualizer 412 and/or GUI 414.

Performance visualizer 412 may at least provide a visualization of a performance for vehicle 100 in a scenario, such as without limitation, where vehicle 100 is an aircraft, a flight scenario. Further, component/performance variables 410 may represent engineering data for performance of vehicle 100 in, without limitation, representations of models for systems for vehicle 100, such as without limitation, mechanical model 402, hydraulic model 404 and/or electrical model 406. Additionally, GUI 414 may at least provide a visualization of a performance for vehicle 100 as engineering data for performance of vehicle 100 provided as, without limitation, a data plot, a graph, a chart, and/or a table.

Further, one of skill in the art understands that a cloud computing, implementation of the teachings recited herein may be used, although the teachings are not limited to a cloud computing environment. Rather, illustrative examples are capable of being implemented in conjunction with any other type of computing environment now known or later developed. Cloud computing is a model of service delivery for enabling convenient, on-demand network access to a shared pool of configurable computing resources, such as, for example, networks, network bandwidth, servers, processing, memory, storage, applications, virtual machines, and services, which can be rapidly provisioned and released with minimal management effort or interaction with a provider of the service. This cloud model may include at least five characteristics, at least three service models, and at least four deployment models.

The characteristics may include, for example, on-demand self-service, broad network access, resource pooling, rapid elasticity, and measured service. On-demand self-service allows a cloud consumer to unilaterally provision computing capabilities, such as server time and network storage, as needed automatically without requiring human interaction with the service's provider. Broad network access may provide for capabilities that are available over a network and accessed through standard mechanisms that promote use by heterogeneous thin or thick client platforms, such as, for example, mobile phones, laptops, and personal digital assistants. Resource pooling allows the provider's computing resources to be pooled to serve multiple consumers using a multi-tenant model, with different physical and virtual resources dynamically assigned and reassigned according to demand. There is a sense of location independence in that the consumer generally has no control or knowledge over the exact location of the provided resources, but may be able to specify location at a higher level of abstraction, such as, for example, country, state, or data center. Rapid elasticity may provide for capabilities that can be rapidly and elastically provisioned, in some cases automatically, to quickly scale out and rapidly released to quickly scale in. To the consumer, the capabilities available for provisioning often appear to be unlimited and can be purchased in any quantity at any time. Measured service allows cloud systems to automatically control and optimize resource use by leveraging a metering capability at some level of abstraction appropriate to the type of service, such as, for example, storage, processing, bandwidth, and active user accounts. Resource usage can be monitored, controlled, and reported providing transparency for both the provider and consumer of the utilized service.

Service models may include, for example, Software as a Service (SaaS), Platform as a Service (PaaS), and Infrastructure as a Service (IaaS). Software as a Service is the capability provided to the consumer to use the provider's applications running on a cloud infrastructure. The applications are accessible from various client devices through a thin client interface, such as a web browser (e.g., web-based e-mail). The consumer does not manage or control the underlying cloud infrastructure including network, servers, operating systems, storage, or even individual application capabilities, with the possible exception of limited user-specific application configuration settings. Platform as a Service is the capability provided to the consumer to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations. Infrastructure as a Service is the capability provided to the consumer to provision processing, storage, networks, and other fundamental computing resources where the consumer is able to deploy and run arbitrary software, which can include operating systems and applications. The consumer does not manage or control the underlying cloud infrastructure, but has control over operating systems, storage, deployed applications, and possibly limited control of select networking components, such as, for example, host firewalls.

Deployment models may include, for example, a private cloud, community cloud, public cloud, and hybrid cloud. A private cloud is a cloud infrastructure operated solely for an organization. The private cloud may be managed by the organization or a third party and may exist on-premises or off-premises. A community cloud is a cloud infrastructure shared by several organizations and supports a specific community that has shared concerns, such as, for example, mission, security requirements, policy, and compliance considerations. The community cloud may be managed by the organizations or a third party and may exist on-premises or off-premises. A public cloud is a cloud infrastructure made available to the general public or a large industry group and is owned by an organization selling cloud services. A hybrid cloud is a cloud infrastructure composed of two or more clouds, such as, for example, private, community, and public clouds, which remain as unique entities, but are bound together by standardized or proprietary technology that enables data and application portability, such as, for example, cloud bursting for load-balancing between clouds.

In some alternative implementations of an illustrative example, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram. Some blocks may be optional.

Figure 11:
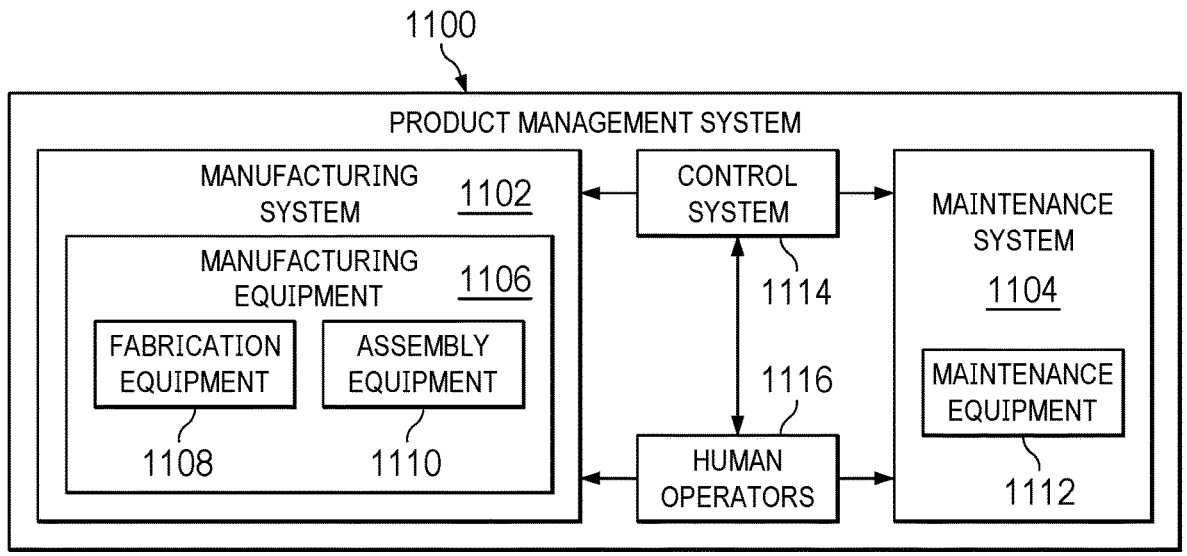
FIG. 11 is an illustration in a form of a block diagram of a product management system depicted in accordance with an illustrative example.

Turning now to FIG. 11, an illustration in a form of a block diagram of a product management system is depicted in accordance with an illustrative example. Product management system 1100 is a physical hardware system. In this illustrative example, product management system 1100 may include at least one of manufacturing system 1102 or maintenance system 1104.

Manufacturing system 1102 is configured to manufacture products and in operation may manufacture. Manufacturing system 1102 may be used to manufacture Robwery processor 400. As depicted, manufacturing system 1102 may include manufacturing equipment 1106. Manufacturing equipment 1106 may include at least one of fabrication equipment 1108 or assembly equipment 1110.

Fabrication equipment 1108 is equipment that may be used to fabricate Robwery processor 400 and or a vehicle control system designed, validated, and/or tested/evaluated using Robwery processor 400. Multiple copies or multiple versions of Robwery processor 400 and/or a system designed, validated, and/or a vehicle control system tested/evaluated using Robwery processor 400 can be fabricated.

Fabrication equipment 1108 can be used to fabricate a number of different structures. For example, fabrication equipment 1108 can be used to fabricate Robwery processor 400 and/or a vehicle control system designed, validated, and/or tested/evaluated using Robwery processor 400, or any components thereof or of the vehicle control system, such as without limitation LCS 104, and other components described in FIGS. 1-10.

Assembly equipment 1110 is equipment used to assemble parts to form a product such as a Robwery processor 400 and/or a vehicle control system designed, validated, and/or tested/evaluated using Robwery processor 400, a computer, an aircraft, or some other product. Assembly equipment 1110 also can include a machine and/or a tool. The machine and/or tool may be without limitation, at least one of: a robotic arm, a spinner system, a sprayer system, an elevator system, a rail-based system, or a robot.

In this illustrative example, maintenance system 1104 may include maintenance equipment 1112. Maintenance equipment 1112 can include any equipment needed to perform maintenance on and evaluation of a product. Maintenance equipment 1112 may include tools for performing different operations on parts on a product. Without limitation, these operations can include at least one of disassembling parts, refurbishing parts, inspecting parts, reworking parts, manufacturing replacement parts, or other operations for performing maintenance on the product. These operations can be for routine maintenance, inspections, upgrades, refurbishment, or other types of maintenance operations.

In the illustrative example, maintenance equipment 1112 may include optical inspection devices, x-ray imaging systems, surface-profile measurement systems, drills, vacuum leak checkers, electrical continuity checkers, display and/or interface analysis and correction tools, computer software and hardware, and other suitable devices. In some cases, maintenance equipment 1112 can include fabrication equipment 1108, assembly equipment 1110, or both to produce and assemble parts that needed for maintenance.

Product management system 1100 also may include control system 1114. Control system 1114 is a hardware system and may also include software or other types of components. Control system 1114 is configured to control and that in operation may control the operation of at least one of manufacturing system 1102 or maintenance system 1104. In particular, control system 1114 can control the operation of at least one of fabrication equipment 1108, assembly equipment 1110, or maintenance equipment 1112.

The hardware in control system 1114 can be implemented using hardware that may include computers, circuits, networks, and other types of equipment. The control may take the form of direct control of manufacturing equipment 1106. For example, robots, computer-controlled machines, and other equipment can be controlled by control system 1114. In other illustrative examples, control system 1114 can manage operations performed by human operators 1116 in manufacturing or performing maintenance on a product. For example, control system 1114 can assign tasks, provide instructions, display models, or perform other operations to manage operations performed by human operators 1116. In these illustrative examples, the different processes for fabricating Robwery processor 400 and/or a vehicle control system designed, validated, and/or tested/evaluated using Robwery processor 400 through suitable devices can be manufactured using processes implemented in control system 1114.

In the different illustrative examples, human operators 1116 can operate or interact with at least one of manufacturing equipment 1106, maintenance equipment 1112, or control system 1114. This interaction can occur to manufacture Robwery processor 400 and/or a vehicle control system designed, validated, and/or tested/evaluated using Robwery processor 400, or other components for use in products such as aircraft, spacecraft, communications systems, computation systems, and sensor systems.

Further, control system 1114 can be used to adjust manufacturing of Robwery processor 400 and/or a vehicle control system designed, validated, and/or tested/evaluated using Robwery processor 400 dynamically during the manufacturing process. For example, many points in the process, of fabricating the Robwery processor 400 and/or a vehicle control system designed, validated, and/or tested/evaluated using Robwery processor 400, as well as other components, are present at which adjustments can be made to control characteristics of components in Robwery processor 400 and/or a vehicle control system designed, validated, and/or tested/evaluated using Robwery processor 400.

Figure 12:
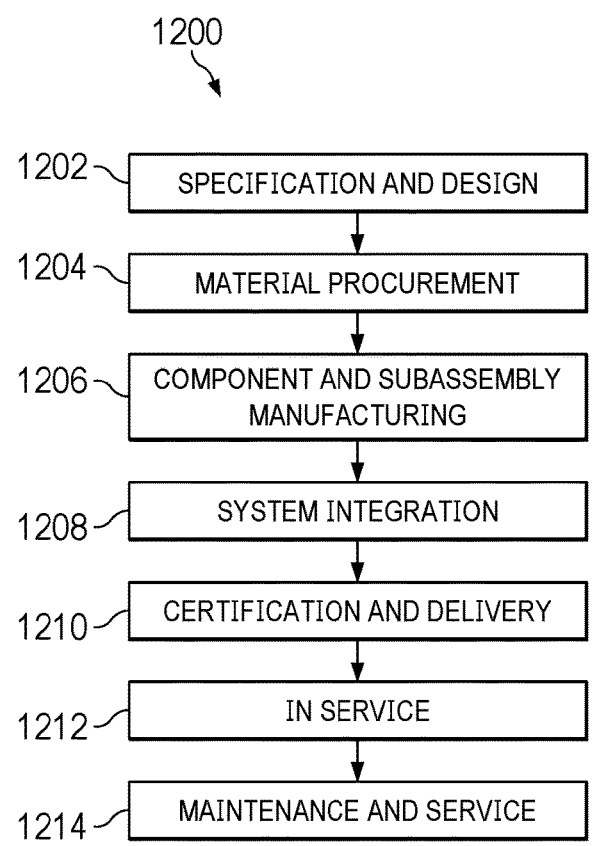
FIG. 12 is an illustration in a form of a block diagram of a manufacturing and service process depicted in accordance with an illustrative example.

Illustrative examples of the present disclosure may be described in the context of a manufacturing and service process 1200 as shown in FIG. 12 for Robwery processor 400 and/or a vehicle control system designed, validated, and/or tested/evaluated using Robwery processor 400, such as without limitation LCS 104. Turning to FIG. 12, an illustration in a form of a block diagram of a manufacturing and service process is depicted in accordance with an illustrative example. During pre-production, manufacturing and service process 1200 may include specification and design 1202 of Robwery processor 400 and/or a vehicle control system designed, validated, and/or tested/evaluated using Robwery processor 400, such as without limitation LCS 104 and material procurement 1204.

During production, component and subassembly manufacturing 1206 and system integration 1208 of Robwery processor 400 and/or a vehicle control system designed, validated, and/or tested/evaluated using Robwery processor 400, such as without limitation vehicle 100 takes place. Thereafter, Robwery processor 400 and/or a vehicle control system designed, validated, and/or tested/evaluated using Robwery processor 400, such as without limitation LCS 104 may go through certification and delivery 1210 in order to be placed in service 1212. While in service 1212 by a customer, Robwery processor 400 and/or a vehicle control system designed, validated, and/or tested/evaluated using Robwery processor 400, such as without limitation LCS 104 may be scheduled for routine maintenance and service 1214, which may include modification, reconfiguration, refurbishment, or other maintenance and service.

Each of the processes of manufacturing and service method 1200 may be performed or carried out by a system integrator, a third party, and/or an operator. In these examples, the operator may be a customer. For the purposes of this description, a system integrator may include, without limitation, any number of vehicle manufacturers and major-system subcontractors; a third party may include, without limitation, any number of vendors, subcontractors, and suppliers; and an operator may be an airline, a leasing company, a military entity, a service organization, and so on.

In some alternative implementations of an illustrative example, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram. Some blocks may be optional. For example, any of operations 1202 through operation 1214 may be optional.

The flowcharts and block diagrams in the different depicted examples above illustrate the architecture, functionality, and operation of some possible implementations of a machine and a process in an illustrative example. In this regard, each block in the flowcharts or block diagrams may represent at least one of a module, a segment, a function, or a portion of an operation or step.

As noted above, all Figures and descriptions above apply to LCS 104 as one example for the larger class of vehicle control systems. Therefore, the description of components and technological improvements for Robwery processor 400 may be more broadly applied to enhance capabilities for analysis and design of a control system for any vehicle. In other words, all components and concepts described above for a system that controls a performance of a vehicle, such as without limitation LCS 104 may equally be applied to other vehicle control systems. In other words, in all Figures and descriptions, for a lateral control system may be applied to a control system for any axis of a vehicle, and references to models for particular systems may be expanded to include additional and/or other models for additional and/or other systems of a vehicle.

Further, as used herein, a first component "connected to" a second component means that the first component can be connected directly or indirectly to the second component. Connection can be physically, electronically, and/or without limitation via communication. In other words, additional components may be present between the first component and the second component. The first component is considered to be indirectly connected to the second component when one or more additional components are present between the two components. When the first component is directly connected to the second component, no additional components are present between the two components.

Additionally, as depicted, Robwery processor 400 can be implemented in at least one of software or hardware. When software is used, the operations performed by Robwery processor 400 may be implemented in program code configured to run and that in operation may run on hardware, such as a processor unit. When firmware is used, the operations performed by Robwery processor 400 may be implemented in program code and data and stored in persistent memory to run on a processor unit. When hardware is employed, the hardware may include circuits that operate to perform the operations in Robwery processor 400.

In the illustrative examples, the hardware may take a form selected from at least one of a circuit system, an integrated circuit, an application specific integrated circuit (ASIC), a programmable logic device, or some other suitable type of hardware configured to perform and that in operation may perform a number of operations. With a programmable logic device, the device may be configured to perform and that in operation may perform the number of operations. The device may be reconfigured at a later time or may be permanently configured to perform and that in operation may perform the number of operations. A programmable logic device may include, for example, a programmable logic array, a programmable array logic, a field programmable logic array, a field programmable gate array, and other suitable hardware devices. Additionally, the processes may be implemented in organic components integrated with inorganic components and may be comprised entirely of organic components excluding a human being. For example, the processes may be implemented as circuits in organic semiconductors. An organic semiconductor is a semiconductor that is comprised of materials such as pi-bonded molecules or polymers made of carbon and hydrogen and may include other elements such as nitrogen, sulfur, and oxygen. These materials are in the form of molecular crystals or amorphous thin films.

Hence, Robwery processor 400 may represent a physical hardware system and may include one or more data processing systems. When more than one data processing system is present, those data processing systems are in communication with each other using a communications medium. The communications medium may, without limitation, be a network or a data bus. The data processing systems may be selected from at least one of a computer, a server computer, a tablet, or some other suitable data processing system.

The illustrations of Robwery processor 400 are not meant to imply physical or architectural limitations to the manner in which an illustrative example may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented as part of Robwery processor 400.

The flowcharts and block diagrams in the different depicted examples illustrate the architecture, functionality, and operation of some possible implementations of apparatuses and methods in an illustrative example. In this regard, each block in the flowcharts or block diagrams can represent at least one of a module, a segment, a function, or a portion of an operation or step. For example, one or more of the blocks can be implemented as program code, hardware, or a combination of the program code and hardware. When implemented in hardware, the hardware may, for example, take the form of integrated circuits that are manufactured or configured to perform and that in operation may perform one or more operations in the flowcharts or block diagrams. When implemented as a combination of program code and hardware, the implementation may take the form of firmware. Each block in the flowcharts or the block diagrams may be implemented using special purpose hardware systems that perform the different operations or combinations of special purpose hardware and program code run by the special purpose hardware.

In some alternative implementations of an illustrative example, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

Thus, the illustrative examples provide a method, apparatus, and system that provide a technical solution, based upon a practical application for analysis for identifying an effect of a component of a system that may control a performance of a vehicle upon the performance of the vehicle. Therefor the application describes above at least example examples described in the following clauses:

Clause 1. A process for identifying a component effect on a performance of a vehicle, the process comprising:
generating a simulation configuration file for a mechanical system configured to control the performance of the vehicle;
generating a simulation configuration file for a power system configured to control the mechanical system of the vehicle;
providing a visual interface for selecting a degraded mode of the selected component within the mechanical system or the power system;
generating a simulation configuration file comprising modification scripting introducing the degraded mode of a selected component within the mechanical system or the power system;
running, using the configuration file for the mechanical system and the configuration file for the power system and the modification scripting of the degraded mode of the selected component, a simulation generating performance data for the vehicle; and
transforming the performance data to a visualization of the performance of the vehicle.

Clause 2. The process of clause 1, wherein the performance comprises performance of the vehicle moving in a fluid.

Clause 3. The process of clause 1, wherein the performance comprises performance in air.

Clause 4. The process of clause 1, wherein the vehicle is an aircraft.

Clause 5. The process of clause 1, wherein the mechanical system comprises: mechanical components, and mechanical dynamics comprising: applied forces and resultant forces on the mechanical components in a fluid flow.

Clause 6. The process of clause 1, wherein the mechanical system comprises a flight control linkage for an aircraft.

Clause 7. The process of clause 1, wherein the mechanical system comprises a flight control linkage for lateral control of an aircraft.

Clause 8. The process of clause 1, wherein the performance data comprises: a position of a tracked component within mechanical system or the power system, forces upon and forces generated by the tracked component within the mechanical system or the power system, and a position and a motion of the vehicle.

Clause 9. The process of clause 1, wherein the performance data comprises: a position of a tracked component within mechanical system or the power system, forces upon and forces generated by the tracked component within the mechanical system or the power system, and a pitch, a roll, a yaw, a pitch rate, a roll rate, a yaw rate, a velocity, an acceleration, and a loading upon an aircraft.

Clause 10. The process of clause 1, wherein the visual interface for selecting the degraded mode of the selected component comprises a graphical user interface presenting a schematic of: the mechanical system, or the power system, configured for receiving a selection of the selected component presented on the schematic.

Clause 11. The process of clause 1, wherein translating the performance data to a visualization comprises using six degrees of freedom equations of motion for generating an output to a user interface that provides a three-dimensional representation of the vehicle in motion over a period of time.

Clause 12. The process of clause 1, wherein translating the performance data to a visualization produces; a graphical presentation, and a data table presentation, of a performance, respectively, of: the power system, the mechanical system, and the vehicle, in three dimensions.

Clause 13. The process of clause 1, wherein the power system comprises a hydraulic system.

Clause 14. The process of clause 1, wherein the power system comprises an electrical system.

Clause 15. The process of clause 1, wherein the power system comprises a pneumatic system.

Clause 16. The process of clause 1, wherein the degraded mode is selectable from a complete failure of the selected component through a range of less than full capability of the selected component.

Clause 17. A process for identifying, using performance data from a vehicle, a degraded mode of a component of a mechanical system or a power system in the vehicle, the process comprising:
generating a simulation configuration file for a mechanical system configured to control the performance of the vehicle;
generating a simulation configuration file for a power system controlling the mechanical system of the vehicle;
generating a simulation configuration file comprising modification scripting introducing the degraded mode of a selected component within the mechanical system or the power system;
running, using the configuration file for the mechanical system and the configuration file for the power system and the modification scripting of the degraded mode of the selected component, a simulation generating performance data for the vehicle;
translating the performance data to a visualization on a user interface of performance characteristics resulting from degraded mode of the selected component;
receiving, on a visual interface, a selection of the selectable performance characteristics; and providing a visualization identifying the degraded mode of the selected component within the mechanical system or the power system.

Clause 18. The process of clause 17, wherein the performance comprises performance of the vehicle moving in a fluid.

Clause 19. The process of clause 17, wherein the performance comprises performance in air.

Clause 20. The process of clause 17, wherein the vehicle is an aircraft.

Clause 21. The process of clause 17, wherein the mechanical system comprises: mechanical components, and mechanical dynamics comprising: applied forces and resultant forces on the mechanical components in a fluid flow.

Clause 22. The process of clause 17, wherein the mechanical system comprises a flight control linkage for an aircraft.

Clause 23. The process of clause 17, wherein the mechanical system comprises a flight control linkage for lateral control of an aircraft.

Clause 24. The process of clause 17, wherein the performance data comprises: a position of a tracked component within mechanical system or the power system, forces upon and forces generated by the tracked component within the mechanical system or the power system, and a position and a motion of the vehicle.

Clause 25. The process of clause 17, wherein the performance data comprises: a position of a tracked component within mechanical system or the power system, forces upon and forces generated by the tracked component within the mechanical system or the power system, and a pitch, a roll, a yaw, a pitch rate, a roll rate, a yaw rate, a velocity, an acceleration, and a loading, upon an aircraft.

Clause 26. The process of clause 17, wherein the visual interface for selecting the degraded mode of the selected component comprises a graphical user interface presenting a schematic of: the mechanical system, or the power system, configured for receiving a selection of the selected component presented on the schematic.

Clause 27. The process of clause 17, wherein translating the performance data to a visualization comprises using six degrees of freedom equations of motion for generating an output to a user interface that provides a three-dimensional representation of the vehicle in motion over a period of time.

Clause 28. The process of clause 17, wherein translating the performance data to a visualization produces; a graphical presentation, and a data table presentation, of a performance, respectively, of: the power system, the mechanical system, and the vehicle, in three dimensions.

Clause 29. The process of clause 17, wherein the power system comprises at least one of: a hydraulic system, an electrical system, or a pneumatic system.

Clause 30. The process of clause 17, wherein the visualization on a user interface of performance characteristics resulting from the degraded mode of the selected component comprises a chart organized by type of characteristic.

Clause 31. The process of clause 17, wherein the visualization on a user interface of performance characteristics resulting from the degraded mode comprises a chart organized by type of characteristic, wherein the type of characteristic comprises at least one of: a position of the selected component of the mechanical system or the power system in the vehicle, a range of motion of the selected component, a vibration of the selected component; a force on the selected component, a force generated by the selected component, or a pitch, a roll, a yaw, a pitch rate, a roll rate, a yaw rate, a velocity, an acceleration, and a loading, upon an aircraft.

Clause 32. The process of clause 17, wherein the user interface receiving a selection of a performance characteristic selection generates a visualization of the selected component associated with the degraded mode generating the performance characteristic.

Clause 33. The process of clause 17, wherein the user interface is configured to receive a selection of a performance characteristic and associate the selection of the performance characteristic with a performance characteristic and generate a visualization of the selected component associated with the degraded mode generating the performance characteristic.

Clause 34. The process of clause 17, wherein the degraded mode is selectable from a complete failure of the selected component through a range of less than full capability of the selected component.

Clause 35. A process for predicting a consequence of a single point failure in a mechanical system of a vehicle on a performance of the vehicle, the process comprising;
generating a simulation configuration file for a mechanical system configured to control a performance of the vehicle;
generating a simulation configuration file for a power system configured to control the mechanical system of the vehicle;
providing a visual user interface for receiving a selection of the degraded mode of the selected component within the mechanical system or the power system;
generating a simulation configuration file comprising modification scripting introducing a degraded mode of a selected component representing the single point failure within the mechanical system or the power system;
running, using the configuration file for the mechanical system and the configuration file for the power system and the modification scripting of the degraded mode of the selected component, a simulation generating performance data for the vehicle; and
transforming the performance data to a visualization of the performance of the vehicle.

Clause 36. The process of clause 35, wherein the performance comprises performance of the vehicle moving in a fluid.

Clause 37. The process of clause 35, wherein the performance comprises performance in air.

Clause 38. The process of clause 35, wherein the vehicle is an aircraft.

Clause 39. The process of clause 35, wherein the mechanical system comprises: mechanical components, and mechanical dynamics comprising: applied forces and resultant forces on the mechanical components in a fluid flow.

Clause 40. The process of clause 35, wherein the mechanical system comprises a flight control linkage for an aircraft.

Clause 41. The process of clause 35, wherein the mechanical system comprises a flight control linkage for lateral control of an aircraft.

Clause 42. The process of clause 35, wherein the performance data comprises: a position of a tracked component within mechanical system or the power system, forces upon and forces generated by the tracked component within the mechanical system or the power system, and a position and a motion of the vehicle.

Clause 43. The process of clause 35, wherein the performance data comprises: a position of a tracked component within mechanical system or the power system, forces upon and forces generated by the tracked component within the mechanical system or the power system, and a pitch, a roll, a yaw, a pitch rate, a roll rate, a yaw rate, a velocity, an acceleration, and a loading, upon an aircraft.

Clause 44. The process of clause 35, wherein the visual interface for selecting the degraded mode of the selected component comprises a graphical user interface presenting a schematic of: the mechanical system, or the power system, configured for receiving a selection of the selected component presented on the schematic.

Clause 45. The process of clause 35, wherein translating the performance data to a visualization comprises using six degrees of freedom equations of motion for generating an output to a user interface that provides a three-dimensional representation of the vehicle in motion over a period of time.

Clause 46. The process of clause 35, wherein translating the performance data to a visualization produces; a graphical presentation, and a data table presentation, of a performance, respectively, of: the power system, the mechanical system, and the vehicle, in three dimensions.

Clause 47. The process of clause 35, wherein the power system comprises at least one of: a hydraulic system, an electrical system, or a pneumatic system.

Clause 48. The process of clause 35, wherein the visualization on a user interface of performance characteristics resulting from the degraded mode of the selected component comprises a chart organized by type of characteristic.

Clause 49. The process of clause 35, wherein the visualization on a user interface of performance characteristics resulting from the degraded mode comprises a chart organized by type of characteristic, wherein the type of characteristic comprises at least one of: a position of the selected component of the mechanical system or the power system in the vehicle, a range of motion of the selected component, a vibration of the selected component; a force on the selected component, a force generated by the selected component, or a pitch, a roll, a yaw, a pitch rate, a roll rate, a yaw rate, a velocity, an acceleration, and a loading, upon an aircraft.

Clause 50. The process of clause 35, wherein the user interface receiving a selection of a performance characteristic generates a visualization of the selected component associated with the degraded mode generating the performance characteristic.

Clause 51. The process of clause 35, wherein the user interface is configured to receive a selection of a performance characteristic and associate the selection of the performance characteristic with a performance characteristic and generate a visualization of the selected component associated with the degraded mode generating the performance characteristic.

Clause 52. The process of clause 35, wherein the degraded mode is selectable from a complete failure of the selected component through a range of less than full capability of the selected component.

Clause 53. A process for identifying, using performance data from a vehicle in motion, a degraded mode for a component on the vehicle in motion, the process comprising:
generating a simulation configuration file for a mechanical system configured to control the performance of the vehicle;
generating a simulation configuration file for a power system controlling the mechanical system of the vehicle;
generating a simulation configuration file comprising modification scripting introducing a degraded mode of a selected component within the mechanical system or the power system;
running, using the configuration file for the mechanical system and the configuration file for the power system and the modification scripting of the degraded mode of the selected component, a simulation generating performance data for the vehicle;
receiving performance data for the vehicle in motion;
mapping the performance data for the vehicle in motion to performance data for the vehicle generated for the degraded mode of the selected component; and
providing a visualization identifying the selected component within the mechanical system or the power system.

The description of the different illustrative examples has been presented for purposes of illustration and description, and is not intended to be exhaustive or limited to the examples in the form disclosed. Many modifications and variations will be apparent to those of ordinary skill in the art. Further, different illustrative examples may provide different features as compared to other illustrative examples. The example or examples selected are chosen and described in order to best explain the principles of the examples, the practical application, and to enable others of ordinary skill in the art to understand the disclosure for various examples with various modifications as are suited to the particular use contemplated.

What is claimed is:

1. A process for identifying an effect from a first component on a performance of a second component of an aircraft, the process comprising:
generating a simulation configuration file in a mechanical model for a mechanical system configured to control the performance of the aircraft;
generating a simulation configuration file in a power model for a power system configured to control the mechanical system of the aircraft;
exchanging component and performance variables comprising: deadband, saturation, stiffness variation, and fluid dynamic states, between the mechanical model, the power model and a performance processor comprising a visual interface;
selecting, using the visual interface, a degraded mode of the first component within the mechanical system or the power system;
generating a simulation configuration file comprising modification scripting introducing the degraded mode of the first component within the mechanical system or the power system;

running, using the simulation configuration file for the mechanical system and the simulation configuration file for the power system and the modification scripting of the degraded mode of the first component, a simulation in the performance processor generating performance data for the aircraft;

storing the performance data in a format rapidly accessible based upon at least each of: forces upon each component within the mechanical system, power generated by each component within the power system, forces generated by each component within the mechanical system or the power system, and a pitch, a roll, a yaw, a pitch rate, a roll rate, a yaw rate, a velocity, an acceleration, and a loading, upon the aircraft; and transforming the performance data to a visualization of the performance of the aircraft.

2. The process of claim 1, wherein the performance comprises a performance of the aircraft in flight.

3. The process of claim 1, further comprising using the visualization and the visual interface for: halting the simulation, modifying scripting of the degraded mode of the first component, resuming the simulation from a point where it was halted.

4. The process of claim 1, further comprising avoiding a full simulation reset when resuming the simulation.

5. The process of claim 1, wherein the mechanical system comprises: mechanical components, and mechanical dynamics comprising:

applied forces and resultant forces on the mechanical components in a fluid flow.

6. The process of claim 1, wherein the mechanical system comprises a flight control linkage for the aircraft.

7. The process of claim 1, wherein the mechanical system comprises a flight control linkage for lateral control of the aircraft.

8. The process of claim 1, wherein the performance data comprises: a position of a tracked component within the mechanical system or the power system, forces generated by the tracked component within the mechanical system or the power system, and a position and a motion of the aircraft.

9. The process of claim 1, wherein the performance data comprises: a position of a tracked component within the mechanical system or the power system, a valve current, a pressure, a flight control surface condition and/or position, and at least one of a position or a velocity of any of: a tab lock, a lock lever, an input arm, a cam, a tab damper, or a flutter damper.

10. The process of claim 1, wherein the visual interface for selecting the degraded mode of the first component comprises a graphical user interface presenting a schematic of: the mechanical system, or the power system, configured for receiving a selection of the selected component presented on the schematic.

11. The process of claim 1, wherein translating the performance data to a visualization comprises using six degrees of freedom equations of motion for generating an output to a user interface that provides a three-dimensional representation of the aircraft in motion over a period of time.

12. The process of claim 1, wherein translating the performance data to a visualization produces; a graphical presentation, and a data table presentation, of a performance, respectively, of: the power system, the mechanical system, and the aircraft, in three dimensions.

13. The process of claim 1, wherein the power system comprises a hydraulic system.

14. The process of claim 1, wherein the power system comprises an electrical system.

15. The process of claim 1, wherein the power system comprises a pneumatic system.

16. The process of claim 1, wherein the degraded mode is selectable from a complete failure of the selected component through a range of less than full capability of the selected component.

17. A process for identifying, using performance data from an aircraft, a degraded mode of a component of a mechanical system or a power system in the aircraft, the process comprising:

generating a simulation configuration file for the mechanical system configured to control a performance of the aircraft;

generating a simulation configuration file for the power system controlling the mechanical system of the aircraft;

generating a simulation configuration file comprising modification scripting introducing the degraded mode of a selected component within the mechanical system or the power system;

exchanging component and performance variables comprising: deadband, saturation, stiffness variation, and fluid dynamic states, between a mechanical model of the mechanical system, a power model of the power system, and a performance processor comprising a visual interface;

running, using the simulation configuration file for the mechanical system and the simulation configuration file for the power system and the modification scripting of the degraded mode of the first component, a simulation generating the performance data for the aircraft;

translating the performance data to a visualization on a user interface of performance characteristics resulting from degraded mode of the selected component;

storing the performance data in a format rapidly accessible based upon at least each of: forces upon each component within the mechanical system, power generated by each component within the power system, forces generated by each component within the mechanical system or the power system, and a pitch, a roll, a yaw, a pitch rate, a roll rate, a yaw rate, a velocity, an acceleration, and a loading, upon the aircraft;

receiving, on a visual interface, a selection of a selectable performance characteristics; and providing a visualization identifying the degraded mode of the selected component within the mechanical system or the power system.

18. A process for predicting a consequence of a single point failure in a mechanical system or a power system configured to control a performance of an aircraft, the process comprising;

generating a simulation configuration file for a mechanical model of the mechanical system;

generating a simulation configuration file for a power model of the power system configured to control the mechanical system of the aircraft;

a performance processor providing a visual user interface for receiving a selection of a degraded mode of a selected component within the mechanical system or the power system;

exchanging component and performance variables comprising: deadband, saturation, stiffness variation, and fluid dynamic states, between the mechanical model, the power model and the performance processor;

generating a simulation configuration file comprising modification scripting introducing the degraded mode of the selected component representing the single point failure within the mechanical system or the power system;

running, using the simulation configuration file for the mechanical system and the simulation configuration file for the power system and the modification scripting of the degraded mode of the selected component, a simulation in the performance processor generating performance data for the aircraft; and storing the performance data in a format rapidly accessible based upon at least each of:

forces upon each component within the mechanical system, power generated by each component within the power system, forces generated by each component within the mechanical system or the power system, and a pitch, a roll, a yaw, a pitch rate, a roll rate, a yaw rate, a velocity, an acceleration, and a loading, upon the aircraft;

transforming the performance data to a visualization of the performance of the aircraft.

19. The process of claim 18, further comprising:

running, using the simulation configuration file for the mechanical system and the simulation configuration file for the power system and the modification scripting of the degraded mode, respectively, of every component of the mechanical system and the power system, a simulation generating performance data for the aircraft.

20. A process for identifying, using performance data from an aircraft in motion, a degraded mode for a component on the aircraft in motion, the process comprising:

generating a simulation configuration file for a mechanical model of a mechanical system configured to control a performance of the aircraft;

generating a simulation configuration file for a power system controlling the mechanical system of the aircraft;

generating a simulation configuration file comprising modification scripting introducing the degraded mode of a selected component within the mechanical system or the power system;

exchanging component and performance variables comprising: deadband, saturation, stiffness variation, and fluid dynamic states, between the mechanical model, the power model and a performance processor comprising a visual interface;

running, using the simulation configuration file for the mechanical system and the simulation configuration file for the power system and the modification scripting of the degraded mode of the selected component, a simulation generating degraded performance data for the aircraft;

receiving the performance data for the aircraft in motion;

storing the performance data in a format rapidly accessible based upon at least each of: forces upon each component within the mechanical system, power generated by each component within the power system, forces generated by each component within the mechanical system or the power system, and a pitch, a roll, a yaw, a pitch rate, a roll rate, a yaw rate, a velocity, an acceleration, and a loading, upon the aircraft;

mapping the performance data for the aircraft in motion to the degraded performance data for the aircraft generated for the degraded mode of the selected component; and providing a visualization identifying the selected component within the mechanical system or the power system.

* * * * *